United States Patent [19]
Hio et al.

[11] Patent Number: 5,758,931
[45] Date of Patent: Jun. 2, 1998

[54] ELECTRIC CONTROL UNIT INTEGRATED WITH A HYDRAULIC UNIT IN AN ANTI-LOCK BRAKE SYSTEM

[75] Inventors: Masahide Hio; Kenji Okamura, both of Yokkaichi; Hitoshi Hashiba, Osaka, all of Japan

[73] Assignees: Sumitomo Wiring Systems, Ltd., Mie; Sumitomo Electric Industries, Ltd., Osaka, both of Japan

[21] Appl. No.: 624,810

[22] Filed: Mar. 27, 1996

[30] Foreign Application Priority Data

| Mar. 30, 1995 | [JP] | Japan | 7-073456 |
| Mar. 30, 1995 | [JP] | Japan | 7-073457 |
| Mar. 30, 1995 | [JP] | Japan | 7-073458 |
| Mar. 30, 1995 | [JP] | Japan | 7-073675 |
| Mar. 30, 1995 | [JP] | Japan | 7-073676 |
| Mar. 30, 1995 | [JP] | Japan | 7-073677 |

[51] Int. Cl.[6] ................................ B60T 8/32
[52] U.S. Cl. ........................ 303/119.2; 303/113.1
[58] Field of Search ................ 303/113.1, 119.2, 303/116.4

[56] References Cited

U.S. PATENT DOCUMENTS

| 4,842,525 | 6/1989 | Galloway et al. | 303/119.2 |
| 5,275,478 | 1/1994 | Schmitt et al. | 303/119.2 |
| 5,407,260 | 4/1995 | Isshiki et al. | 303/119.2 |
| 5,449,227 | 9/1995 | Steinberg et al. | 303/119.2 |
| 5,452,948 | 9/1995 | Cooper et al. | 303/119.2 |
| 5,462,344 | 10/1995 | Jakob et al. | 303/179.2 |
| 5,520,447 | 5/1996 | Burgdorf et al. | 303/119.2 |
| 5,520,546 | 5/1996 | Klinger et al. | 303/119.2 |

FOREIGN PATENT DOCUMENTS

| 499670 | 8/1992 | European Pat. Off. | 303/119.2 |
| 519736 | 12/1992 | European Pat. Off. | 303/119.2 |
| 0 673 805 A1 | 9/1995 | European Pat. Off. | |
| 6144181 | 5/1994 | Japan | 303/119.2 |
| 6-239217 | 8/1994 | Japan | |
| 9403352 | 2/1994 | WIPO | 303/119.2 |

Primary Examiner—Matthew C. Graham
Attorney, Agent, or Firm—Oliff & Berridge, PLC

[57] ABSTRACT

A connecting structure for connecting the connector terminal unit with the printed mounting board in which the degree of freedom is high with respect to the attaching posture and attaching position of the connector terminal unit, and further the error allowed in the manufacturing process of the printed mounting board and the error allowed in the assembling process of the printed mounting board to the case may be increased. An auxiliary wiring board is electrically connected onto a reverse side of a connector terminal arranged penetrating the connector terminal unit, and also the auxiliary wiring board is electrically connected onto the printed mounting board by FPC (flexible printed circuit board). The attaching posture and attaching position of the connector terminal unit can be arbitrarily determined in a range of the length of FPC. Therefore, the degree of freedom of the attaching posture and attaching position of the connector terminal unit can be enhanced, and further the error allowed in the manufacturing process of the printed mounting board and the error allowed in the assembling process of the printed mounting board to the case may be increased.

25 Claims, 23 Drawing Sheets

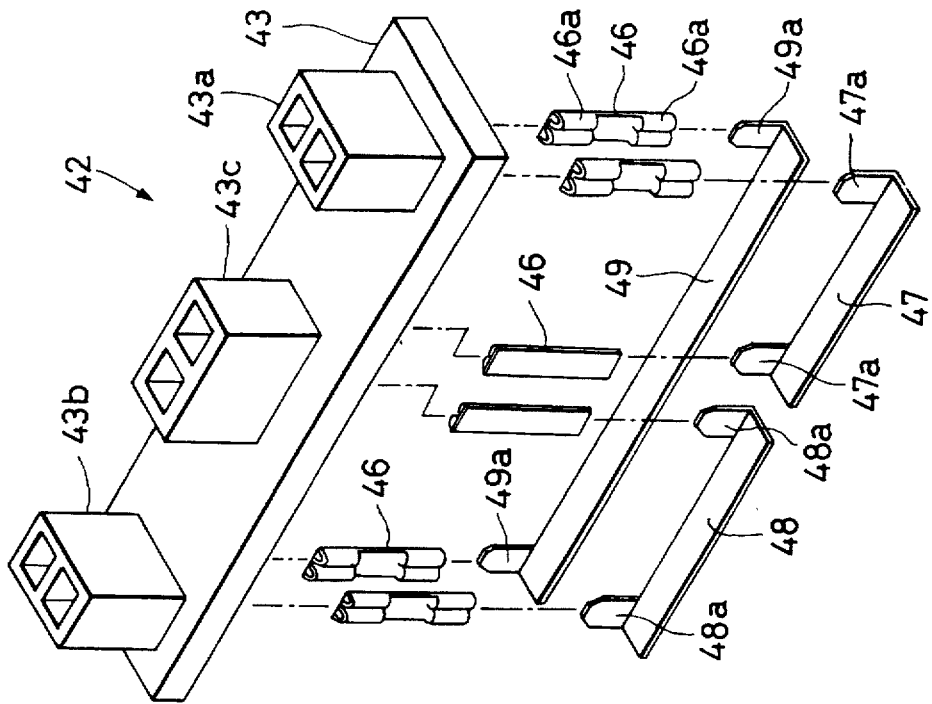
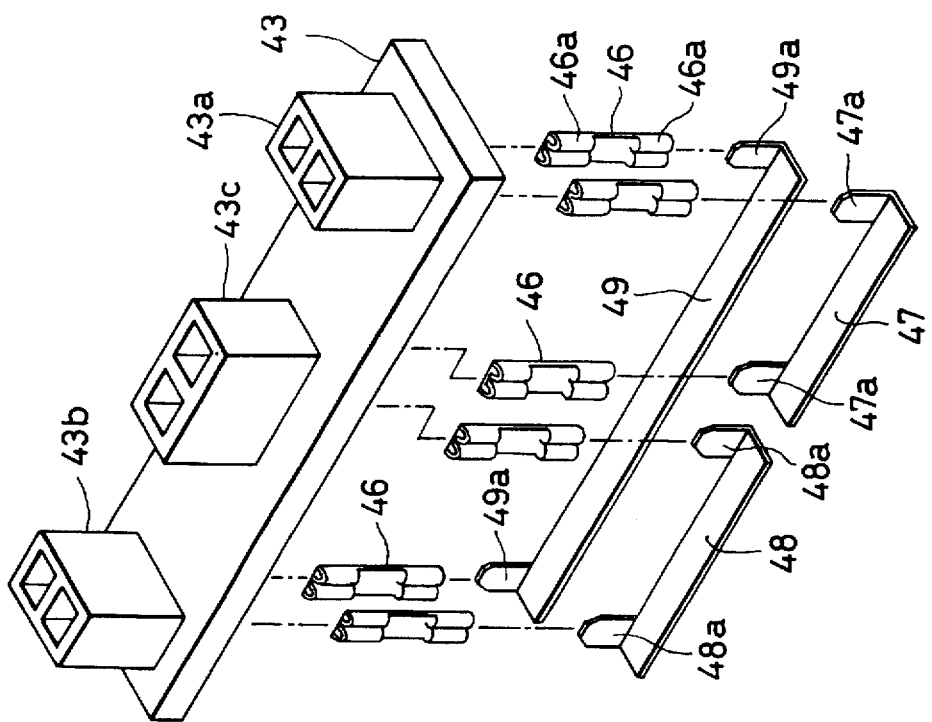

ELECTRIC CONTROL UNIT INTEGRATED WITH A HYDRAULIC UNIT IN AN ANTI-LOCK BRAKE SYSTEM

BACKGROUND OF THE INVENTION

The present invention relates to a connecting structure for connecting a wiring board arranged at a predetermined position in a case of an electronic unit used for a vehicle, electrical equipment and office automation device, with a connector terminal unit arranged in a connector housing of the case under the condition that a reverse side of the connector terminal unit is directed to the inside of the case. Also, the present invention relates to an assembling method thereof.

More particularly, the present invention relates to an electronic control unit integrated with a hydraulic unit in an anti-lock brake system of a vehicle which prevents wheels of the vehicle from locking in the case of applying a sudden brake or applying a brake when the vehicle is running on a slippery road, by adjusting the pressure of brake fluid.

In general, in the electronic unit used for a vehicle, electrical equipment and office automation device, there is provided a connector terminal unit for electrically connecting a printed mounting board arranged in the electronic unit with an electrical device arranged outside the electronic unit.

The conventional connecting structure for connecting the connector terminal unit with the printed mounting board is shown in FIGS. 1 and 2, which will be described as follows. The connecting structure includes: a printed mounting board 201a, 201b accommodated at a predetermined position in an electronic unit case 200a, 200b; and a connector terminal unit 203a, 203b accommodated in a connector housing 202a, 202b in the electronic unit case 200a, 200b. In the connector terminal unit 203a, 203b, there are provided a plurality of connector terminals 204a, 204b which penetrate the connector terminal unit.

On a reverse side of the printed mounting board 201a, 210b, there is provided a printed wiring pattern (not shown in the drawings) made of copper foil, and also electronic parts (not shown in the drawings) are mounted, and an appropriate electrical circuit is composed. A connector terminal 204a, 204b is arranged in the connector terminal unit 203a, 203b in such a manner that the connector terminal penetrates the connector terminal unit from the front side facing the outside of the connector terminal unit 203a, 203b to the reverse side facing the inside of the electronic unit case 200a, 200b. On the front side, an end of the connector terminal 204a, 204b is exposed to the outside so that an external connector (not shown in the drawings) can be connected. On the reverse side, the other end of the connector terminal 204a, 204b is extended straight or in an L-shape, and the end portion of the connector terminal 204a, 204b is formed into a terminal portion 205a, 205b. This terminal portion 205a, 205b is inserted into and soldered with a through-hole (not shown in the drawings) formed on the printed mounting board 201a, 201b. In this way, the connector terminal 204a, 204b is electrically connected with the printed mounting board 201a, 201b.

In this connection, in the above connecting structure in which the connector terminal unit 203a, 203b is connected with the printed mounting board 201a, 201b, the terminal portion 205a, 205b is inserted into the through-hole substantially perpendicular to the surface of the printed mounting board 201a, 201b.

Accordingly, in the case where the connector housing 202a is open upward with respect to the electronic unit case 200a as shown in FIG. 1, the connector terminals 204a are formed straight, and the terminal portion 205a can be inserted into the through-holes while the terminal portion 205a is maintained substantially perpendicular to the printed mounting board 201a. In the case where the connector housing 202b is open onto the side of the electronic unit case 200b as shown in FIG. 2, the connector terminals 204a are bent into L-shapes on the reverse side of the connector terminal unit 203b, and then the terminal portion 205b can be inserted into the through-holes while the terminal portion 205b is maintained substantially perpendicular to the printed mounting board 201b.

As described above, in the conventional connecting structure, it is necessary to appropriately change the shapes of the connector terminals 204a, 204b in accordance with the position and posture of the connector housing 202a, 202b in which the connector terminal unit 203a, 203b is accommodated. Due to the foregoing, the arrangement of the terminal portion 205a, 205b of the connector terminals 204a, 204b is changed, and it is necessary to appropriately change the positions of the through-holes on the printed mounting board 201a, 201b and also to change the printed wiring pattern.

Therefore, for example, when the position and shape of the connector housing 202a, 202b are changed under the necessity of changing the design, it is necessary to change the design of the connector terminal unit 203a, 203b and the printed mounting board 201a, 201b.

Unless the printed mounting board 201a, 201b is manufactured with high accuracy and assembled to the electronic unit case 200a, 200b with high accuracy, the positions of through-holes formed on the printed mounting board 201a, 201b deviate from the predetermined positions, so that the connector terminals 204a, 204b extending from the connector terminal unit 203a, 203b can not penetrate the through-holes.

Especially when a plurality of connector terminal units are provided in the electronic unit, it is necessary to connect all the connector terminals with the printed mounting board 201a, 201b. Therefore, the printed mounting board 201a, 201b must be manufactured more accurately and assembled to the electronic unit case 200a, 200b with higher accuracy.

The following are descriptions of the electronic control unit integrated with a hydraulic unit in a conventional anti-lock brake system of a vehicle.

For example, as one of the systems by which safety can be enhanced in the driving of an automobile, there is provided an anti-lock brake system by which wheels of an automobile are prevented from locking when a sudden brake is applied to the automobile or when the automobile is given a brake in the running on a slippery road. Recently, with the progress of technology, performance of the automobile is highly enhanced. In order to enhance the performance, a large number of automobiles are equipped with the anti-lock brake systems described above.

This type anti-lock brake system includes: a rotation detecting device for detecting the rotation of each wheel; an electronic control section for controlling the pressure of brake fluid so that the wheel can not lock; and a hydraulic unit for adjusting the pressure of brake fluid of each wheel in accordance with a control signal sent from the electronic control section.

A detection signal sent from the rotation detecting device is inputted into the electronic control section. According to this detection signal, it is monitored whether or not wheels are locked when the brake is applied. When it is judged that the wheels are locked in the process of braking, the hydraulic unit is controlled, and the pressure of brake fluid of the wheel cylinder of the wheel concerned is reduced. When it is judged that there is no possibility of locking, the pressure of brake fluid of the wheel is raised again.

Also, there is provided an electronic control unit integrated with a hydraulic unit in an anti-lock brake system in which the integrated electronic control unit and hydraulic unit are arranged in an engine room, so that the cabin space can be increased and the harness work can be simplified.

For example, this type anti-lock brake system is disclosed in Japanese Unexamined Patent Publication No. 6-239217. In order to effectively utilize the space in an automobile and simplify the harness work, as shown in FIGS. 3 and 4, the above Unexamined Patent Publication discloses an electronic control unit integrated with a hydraulic unit including: an electronic control unit 301 provided with an electronic control section 304 for controlling the pressure of brake fluid so that each wheel of the automobile is not locked; and a hydraulic unit 302 for adjusting the pressure of brake fluid of each wheel in accordance with a control signal sent from the electronic control section 304.

The above electronic control unit 301 includes: a printed wiring board 321 which forms an electronic control section 304 for controlling the pressure of brake fluid in accordance with the signals sent from rotation detecting devices 303a to 303d to detect the rotation of each wheel of the automobile so that each wheel can not be locked; a motor relay 307 for controlling a motor 306, which will be described later, in accordance with the control signal sent from the electronic control section 304; and a fail-safe relay 308 for stopping the operation of the system when a problem has occurred in the anti-lock brake system.

The hydraulic unit 302 is integrally attached to an upper portion of the electronic control unit 301 by a bracket 310. The hydraulic unit 302 is provided with solenoid valves 305a to 305d. The solenoid valves 305a to 305d are controlled to be opened and closed in accordance with a control signal sent from the electronic control section 304, so that the pressure of brake fluid given to the wheel cylinder of each wheel (not shown) is controlled. On a side of the case 302a of the hydraulic unit 302, there is provided a motor 306 for driving a pump not shown in accordance with the control signal so as to return the brake fluid to the master cylinder.

In the above electronic control unit integrated with a hydraulic unit, there is provided a battery 310 used as an electrical power source of the anti-lock brake system of the automobile. The power circuit in which electrical power is supplied from the battery 310 to the motor 306 via the motor relay 307 is composed of a wiring pattern provided on the printed wiring board 321 accommodated in the case 301a.

An electrical current flows from the battery 310 to the motor 306 as follows. The electrical current is supplied from the battery 310 to the wiring pattern on the printed wiring board 321 via the connector 320 (shown in FIG. 4) provided on the case 301a of the electronic control unit 301. Then the electrical current flows in a contact portion of the motor relay 307 attached onto the printed wiring board 321. After that, the electrical current flows again in the wiring pattern on the printed wiring board 321 and is supplied to the motor 306 disposed in an upper portion of the electronic control unit 301 via a lead wire (not shown).

In FIG. 4, reference numeral 311 is an ignition switch, reference numeral 312 is a stop lamp switch disposed close to a brake pedal, reference numeral 313 is a stop lamp composing a portion of the rear lamp, reference numeral 314 is a warning lamp for telling the occurrence of an abnormality, and reference numeral 315 is a diode for turning on the warning lamp 314.

However, when the electronic control unit integrated with a hydraulic unit is arranged in an engine room as disclosed in the patent publication described before, it is necessary to provide a relatively large space for installing the electronic control unit integrated with a hydraulic unit in the engine room.

However, according to the electronic control unit integrated with a hydraulic unit disclosed in the publication described before, a male connecting terminal of each solenoid valve provided in the hydraulic unit protrudes downward from a lower face of the hydraulic housing, and a corresponding female connecting terminal is provided in the electronic control unit. Therefore, when the hydraulic unit is integrally connected with the electronic control unit, each male connecting terminal on the solenoid valve side and each female connecting terminal on the electronic control unit side are connected with each other.

Therefore, in the process of quality control or transportation of the hydraulic unit before it is assembled to the electronic control unit, the male connecting terminals directly protruding from a lower face of the hydraulic housing come into contact or collide with other parts. That is, there is a possibility that the male connecting terminals are damaged by the contact or collision.

In the above electronic control unit integrated with a hydraulic unit, the electrical power circuit of the motor 306 is composed of a printed wiring pattern provided on the printed wiring board 321 in the electronic control unit 301. Therefore, a high intensity of electrical current, for example, an electrical current, the intensity of which is not less than 40 A, flows on the printed wiring board 321 for driving the motor. In general, the electrical current capacity of the printed wiring pattern is small. Accordingly, there is a possibility that an over-current flows in the printed wiring pattern and the breaking of wire is caused.

However, in the electronic control unit integrated with a hydraulic unit disclosed in the patent publication described before, a large number of electrical wires such as a signal wire connected with the rotation detecting device provided in each wheel, an electrical power source wire and an earth wire must be connected with the electronic control section. Therefore, it is necessary to provide a connector terminal unit of a relatively large size in the electronic control unit. As a result, the size of the electronic control unit is determined by the size of the connector terminal unit. In this connection, the connector terminal unit is attached to the electronic control unit case in such a manner that attaching pieces are provided on two sides of the outer circumference of the connector terminal unit being opposed to the main body, and the attaching pieces are screwed to the case. Therefore, in addition to a space for accommodating the electronic control unit itself, another space is required for installing the aforementioned attaching structure of the connector terminal unit. Accordingly, the size of the electronic control unit integrated with a hydraulic unit is increased.

When the electronic control unit provided with an electronic control section is integrated with the hydraulic unit, the connecting terminals on the solenoid valve side protruding downward from a lower face of the hydraulic housing of the hydraulic unit and the connecting terminals on the motor side must be connected with the corresponding connecting terminals on the electronic control unit side. Accordingly, it is necessary for the connecting terminals of each unit to be assembled with high accuracy.

SUMMARY OF THE INVENTION

The present invention has been accomplished to solve the above problems. An object of the present invention is to provide a connecting structure for connecting a connector terminal unit with a wiring board and also to provide assembling method thereof characterized in that: it is possible to use a common connector terminal unit and wiring board even if the position and posture of a connector housing are changed; and it is possible to provide a wide allowable range with respect to the error caused in the process of manufacturing a wiring board and the error caused when the wiring board is assembled to a case.

Another object of the present invention is to provide a compact electronic control unit integrated with a hydraulic unit in an anti-lock brake system.

Still another object of the present invention is to provide an electronic control unit integrated with a hydraulic unit in an anti-lock brake system in which the male connecting terminals protruding from the hydraulic housing are prevented from being damaged.

Still another object of the present invention is to provide an electronic control unit integrated with a hydraulic unit in an anti-lock brake system having a motor power source circuit in which a high intensity of electrical current can be made to flow to drive a motor.

Still another object of the present invention is to provide an electronic control unit integrated with a hydraulic unit in an anti-lock brake system which can be made compact by reducing the size of the attaching structure of the connector terminal unit.

Still another object of the present invention is to provide an electronic control unit integrated with a hydraulic unit in an anti-lock brake system in which the assembling accuracy of the electronic control unit is enhanced.

In order to solve the above problems, the present invention is to provide a connecting structure for connecting a connector terminal unit with a wiring board in which the wiring board accommodated at a predetermined position in the case is connected with the connector terminal unit accommodated in the connector housing under the condition that a reverse side of the connector terminal unit is directed into the case, and the connecting structure comprises: an auxiliary wiring board attached onto the reverse side of the connector terminal unit, the auxiliary wiring board being electrically connected with connector terminals which are arranged penetrating the connector terminal unit; and flexible electrical wires attached between the wiring board and the auxiliary wiring board, wherein the connector terminal unit is electrically connected with the wiring board by the auxiliary wiring board.

According to the connecting structure for connecting the connector terminal unit with the wiring board arranged as described above, the connector terminals which penetrate the connector unit are electrically connected with the wiring board via the flexible electrical wire. Therefore, the posture and position of the connector terminal unit can be freely moved within a range determined by the length of the flexible electrical wire. Further, when the wiring board and the connector terminal unit are electrically connected with each other via the flexible electrical wire, the relative positions of the wiring board and the connector terminal unit can be freely determined. Accordingly, it is possible to electrically connect the wiring board with the connector terminal unit irrespective of small errors caused in the process of manufacturing the wiring board and small errors caused in the process of assembling the wiring board to the case.

An assembling method for assembling the connector terminal unit to a wiring board of the present invention, comprises the steps of: integrally forming a wiring board and an auxiliary wiring board so that they can be freely detached from each other; electrically connecting one end of the flexible electrical wire with the wiring board; electrically connecting the other end of the flexible electrical wire with the auxiliary wiring board; separating the auxiliary wiring board from the wiring board; electrically connecting the auxiliary wiring board with the connector terminal penetrating the connector terminal unit, by attaching the auxiliary wiring board onto a reverse side of the connector terminal unit; accommodating the connector terminal unit in the connector housing under the condition that the reverse side of the connector terminal unit is directed into the case; and accommodating the wiring board at a predetermined position in the case.

According to the above assembling method for assembling the connector terminal unit to the wiring board, the wiring board and the auxiliary wiring board are integrally formed so that they can be freely separated from each other. Therefore, it is easy to form the respective boards. Before the boards are separated from each other, the flexible electrical wire is connected to each board. Accordingly, the electrical wire connection can be easily conducted.

An electronic control unit integrated with a hydraulic unit in an anti-lock brake system of the present invention comprises: a rotation detecting device for detecting a rotating condition of each wheel of an automobile; a hydraulic unit for controlling the brake fluid pressure in a wheel cylinder of each wheel by opening and closing a solenoid valve through a solenoid coil in a hydraulic housing in accordance with an electronic control signal, the hydraulic unit having a motor to drive a pump for returning the brake fluid to a master cylinder; an electronic control unit for making the control signal to control the brake fluid pressure in accordance with the detection conducted by the rotation detecting device; a fail-safe relay for supplying and stopping an electrical power supply to a solenoid provided in the electronic control unit and also an electrical power supply to a motor relay; and a motor relay for supplying and stopping an electrical power supply to the motor, wherein male terminals on the solenoid coil side protruding downward from a lower face of the hydraulic housing are connected with connecting terminals on the electronic control unit side when the hydraulic unit is mechanically connected with the electronic control unit.

In the electronic control unit integrated with a hydraulic unit in an anti-lock brake system of the present invention, a connecting portion of the connector on the electronic control unit side to which an external connector for supplying electrical power is connected is arranged being extended into a clearance formed between an upper face of the case of the electronic control unit and the motor.

In the electronic control unit integrated with a hydraulic unit in an anti-lock brake system of the present invention, a connecting portion of the connector on the electronic control unit side to which an external connector is connected is arranged being extended into a clearance formed between an upper face of the case of the electronic control unit and the motor. Accordingly, a dead space formed between the upper face of the case of the electronic control unit and the motor can be effectively utilized and the overall electronic control unit integrated with the hydraulic unit can be made compact.

The electronic control unit integrated with a hydraulic unit in an anti-lock brake system of the present invention comprises a solenoid female connector composed of a U-shaped female—female relay terminal and a resin housing. In this case, the U-shaped female—female relay terminal has female connecting portions at both ends with which male terminals on the solenoid coil side and male terminals connected with the printed mounting board on the electronic control unit side are connected. Therefore, the hydraulic unit and the electronic control unit are mechanically connected with each other via the solenoid female connector, and at the same time the male terminals on the solenoid coil side and the electronic control unit are electrically connected.

In the electronic control unit integrated with a hydraulic unit in an anti-lock brake system of the present invention, the solenoid female connector includes a U-shaped female—female relay terminal having female connecting portions at both ends, and male terminals protruding from the hydraulic housing are connected with one of the female connecting portions of the female—female relay terminal, and male terminals on the electronic control unit side are connected with the other female connecting portion of the female—female relay terminal. When quality control and transportation of the hydraulic unit is conducted under the condition that the male terminals on the solenoid coil side protruding from a lower face of the hydraulic housing of the hydraulic unit are connected with one of the female connecting portions of the female—female relay terminal of the solenoid female connector, male terminals do not protrude outside directly, but they can be protected by the resin housing. Accordingly, it is possible to prevent the male terminals from contacting or colliding with other parts, so that the male terminals can be prevented from being damaged. As a result, quality control can be easily carried out.

When the U-shaped female—female relay terminals are used, in the connection of the male terminals on the solenoid coil side in the hydraulic housing with the male terminals on the electronic control unit side, it is possible to absorb a positional error which is in a range of allowance. Accordingly, the degree of freedom can be enhanced in the process of positioning the electronic control unit and the hydraulic unit.

Since the female—female relay terminal is bent into a U-shape, it is possible to reduce the height of the connecting structure, so that the overall structure can be made compact.

In the electronic control unit integrated with a hydraulic unit in an anti-lock brake system of the present invention, in the case, there is provided a connector portion for supplying electrical power to the motor, and also there is provided a motor relay for controlling to feed electrical power from the connector portion to the motor when the contact point is turned on and off in accordance with a control-signal sent from the electronic control section. Also, in the case, there are provided a motor power source supply terminal of the connector portion and a motor relay terminal for electrically connecting with the contact point of the motor relay. The motor power feeding terminal penetrates the case and extends into the case. When the above terminals are electrically connected with each other by a bus bar in the case, an electrical power feeding path for feeding electrical power to the motor is formed.

In the electronic control unit integrated with a hydraulic unit in an anti-lock brake system of the present invention, the motor power source supply terminal, the motor relay terminal and the motor power feeding terminal are electrically connected with each other by the bus bar. Therefore, a power feeding path to feed power to the motor is composed of the bus bar, the electrical current capacity of which is large, in the electronic control unit. Accordingly, it is possible to form a motor power feeding circuit of large capacity.

In the electronic control unit integrated with a hydraulic unit in an anti-lock brake system of the present invention, the connector terminal unit accommodated in the connector housing of the case of the electronic control unit has a main body provided with a plurality of connector terminals. An engaging protrusion is formed on one side of the outer circumferential side face of the main body, and a fixing portion is formed on the other side face. On the inner circumferential face side of the connector housing, there is provided an engaging step portion capable of engaging with the engaging protrusion in the direction of insertion of the external connector. Also, there is provided an attaching portion to which the fixing portion is fixed. When the fixing portion is put on and fixed to the attaching portion under the condition that the engaging protrusion of the main body is engaged with the engaging step portion, the connector terminal unit is accommodated in the connector housing.

According to the electronic control unit integrated with a hydraulic unit in an anti-lock brake system arranged as described above, the connector terminal unit is accommodated in the connector housing when the engaging protrusion on one face of the outer circumferential side face of the main body is engaged with the engaging step portion on the connector housing side in the direction of insertion of the external connector, and the fixing portion on the other side is put on and fixed to the attaching portion on the connector housing side. Accordingly, only when the other side of the main body is fixed, the connector terminal unit can be fixed. In this connection, when the external connector is connected with the connector terminal unit, the mechanical strength can be maintained sufficiently high to resist a pushing force applied to the connector because the engaging protrusion is engaged with the engaging step portion on the connector housing side.

According to the electronic control unit integrated with a hydraulic unit in an anti-lock brake system of the present invention, the electronic control section includes a printed mounting board. The case of the electronic control unit is composed of an upper case made of aluminum by means of die casting and a plate-shaped lower case which closes an opening portion on the lower side of the upper case. In the upper case, there is provided a connector connecting portion with which the external connector for supplying electrical power is connected. The external connector is electrically connected with the connector connecting portion of the upper case, and the connector terminal unit is fixed by screws, and the printed mounting board is fixed to the upper case by screws. Further, an electrical connection box is fixed to the upper case by screws, wherein the electrical connection box composes a motor drive circuit when the connecting terminals on the connector terminal unit side, the motor relay side on the printed mounting board and the motor side are connected with each other. In the solenoid connector connecting portion provided with the connecting terminal on the electronic unit side with which the connecting terminal on the solenoid valve side is connected, there is provided an engaging portion engaged with and held by the upper case.

According to the present invention, the connector terminal unit accommodated in the case of the electronic control unit, the printed mounting board, the electrical connection box and the solenoid connector connecting portion are directly fixed to the upper case made of aluminum by means of die casting. Due to the above assembling system, it is sufficient to give consideration to the manufacturing error caused between each member and the upper case. Accordingly, as compared with an assembling system in which the members are fixed to the upper case under the condition that they have already been assembled, the manufacturing errors of the members are not accumulated, and the assembly allowance can be reduced. Therefore, the assembling accuracy of the electronic control unit can be enhanced.

BRIEF DESCRIPTION OF THE DRAWINGS

FIGS. 24A and 24B are exploded perspective views of the electrical connection box;

DETAILED DESCRIPTION OF PREFERRED EMBODIMENT

Figure 1:
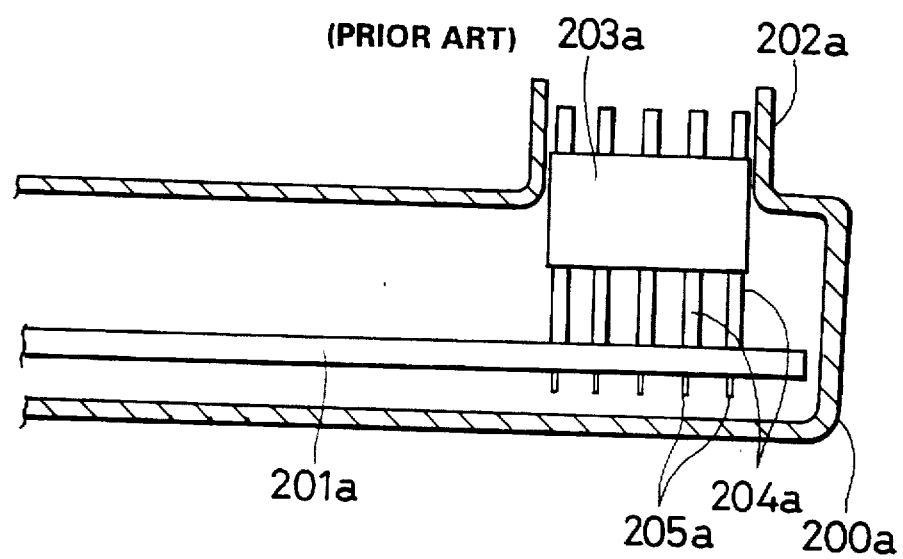
FIG. 1 is a cross-sectional view showing a conventional connecting structure of the connector terminal unit and the printed mounting board.
Figure 2:
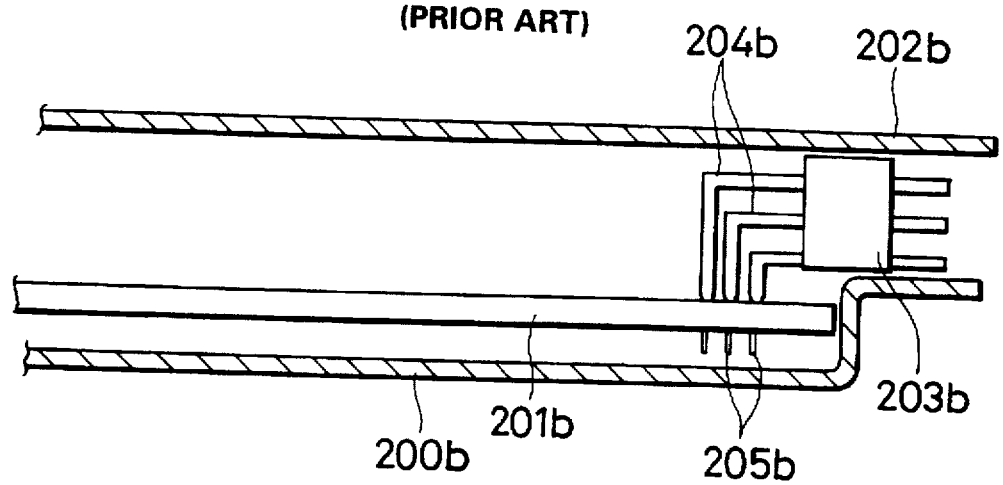
FIG. 2 is a cross-sectional view showing anther conventional connecting structure of the connector terminal unit and the printed mounting board.
Figure 3:
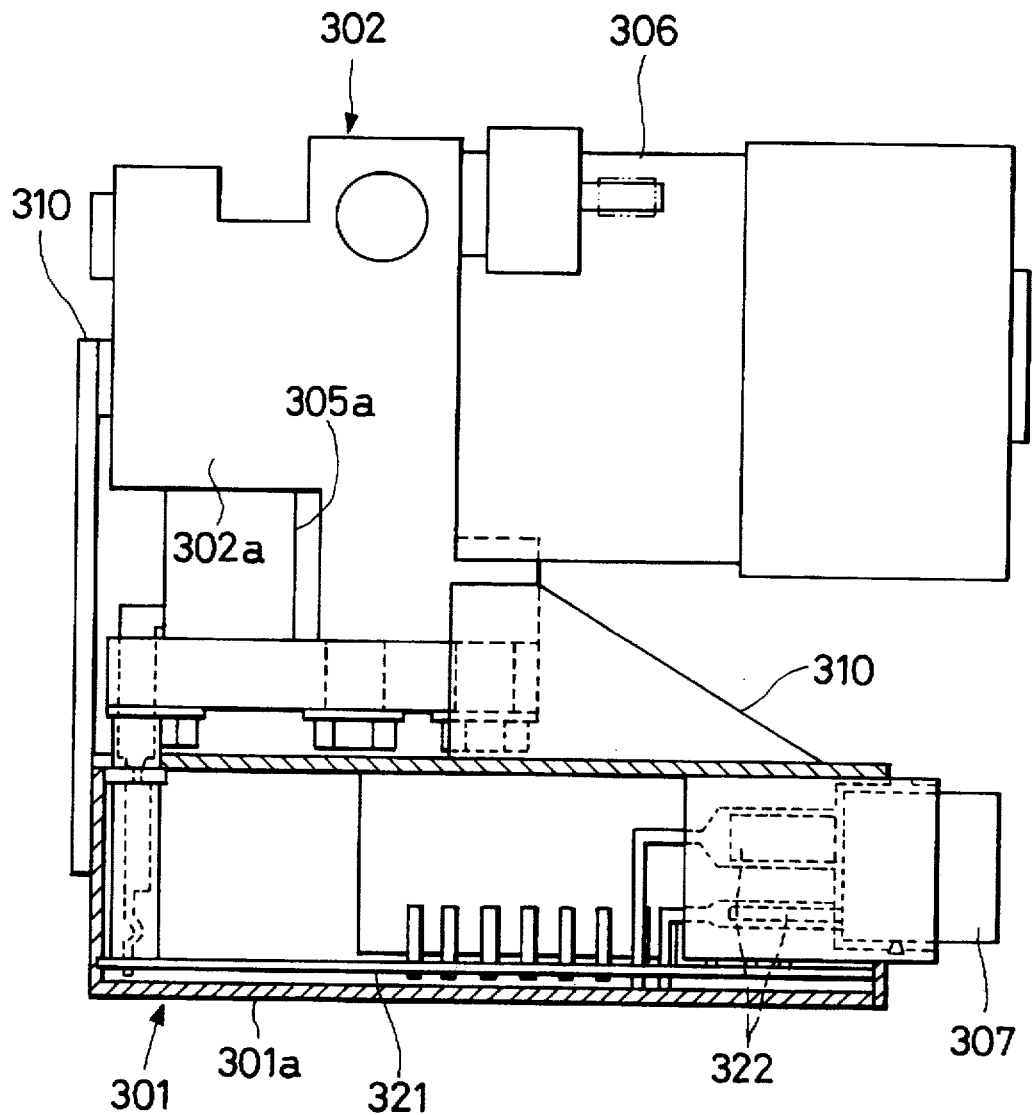
FIG. 3 is a view showing an electronic control unit integrated with a hydraulic unit in a conventional anti-lock brake system.
Figure 4:
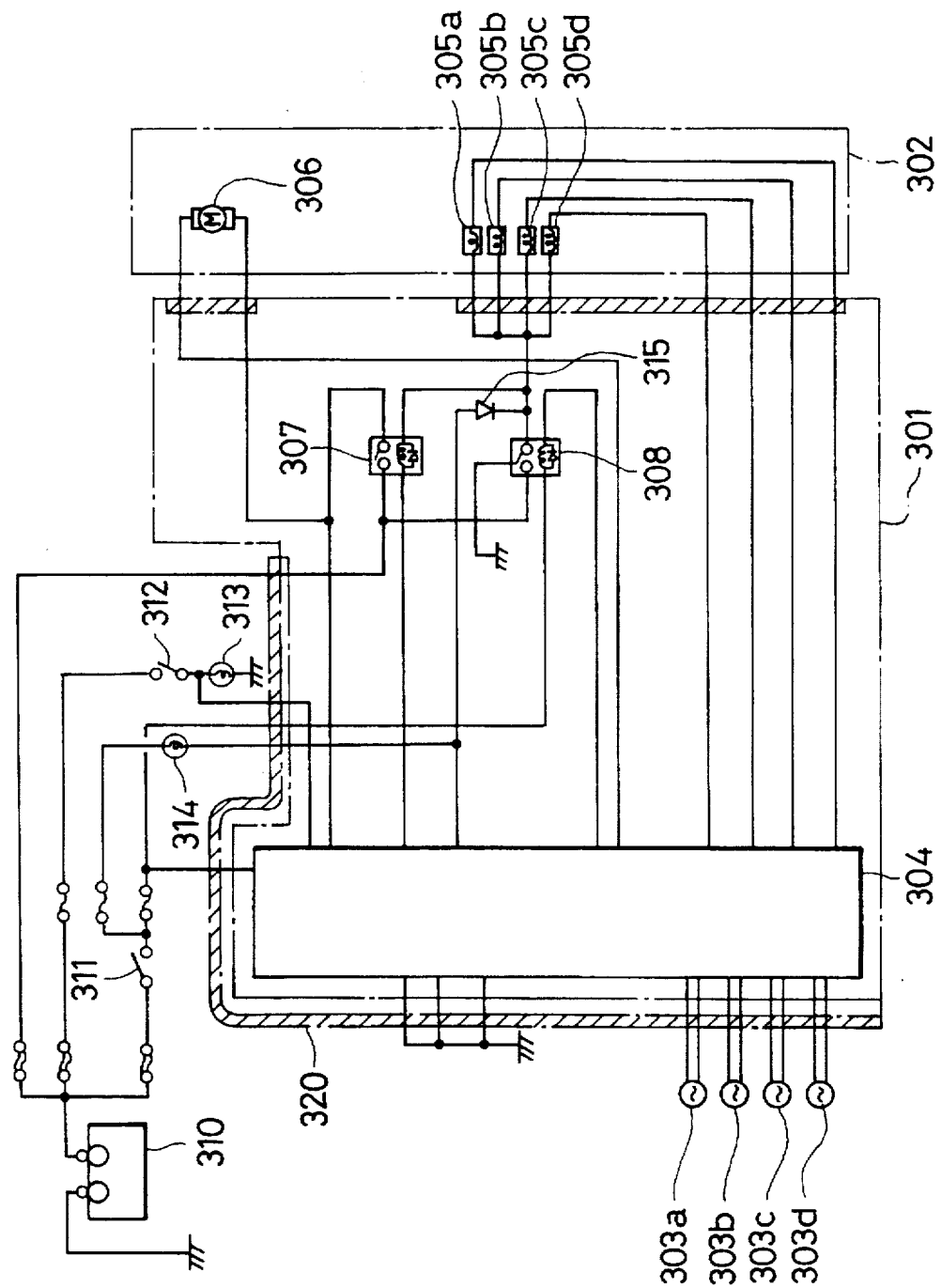
FIG. 4 is an electrical wiring diagram of the electronic control unit.

Referring to the accompanying drawings, descriptions will be given to an electronic control unit integrated with a hydraulic unit in an anti-lock brake system of an automobile to which the connecting structure for connecting a connector terminal unit with a wiring board of an embodiment of the present invention is applied. In FIGS. 5 to 9, reference numeral 1 is an electronic control unit, the upper portion of which is integrally connected with a hydraulic unit 2. The electronic control unit 1 and the hydraulic unit 2 compose an electronic control unit integrated with a hydraulic unit in an anti-lock brake system.

Figure 10:
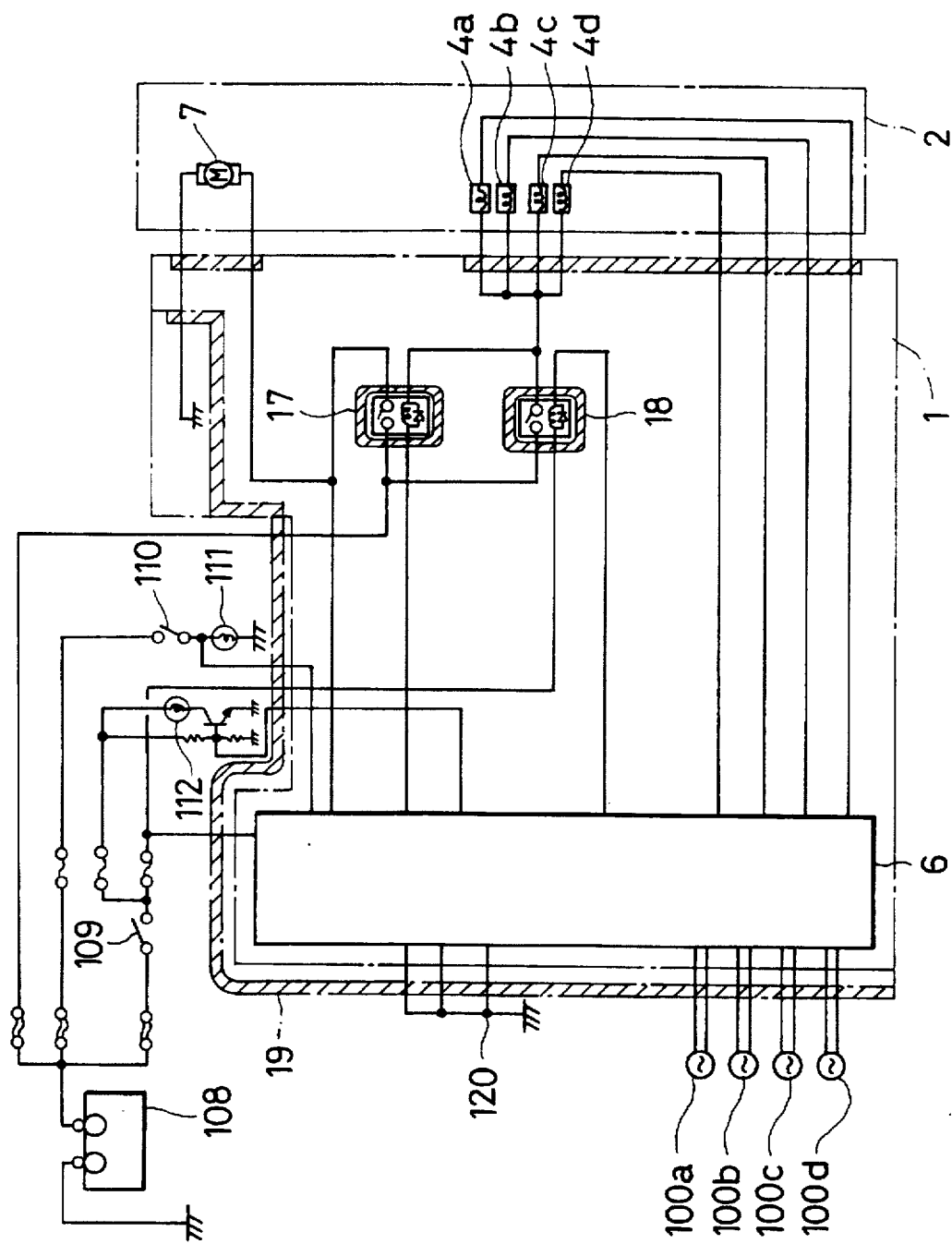
FIG. 10 is an electrical wiring diagram of the electronic control unit integrated with a hydraulic unit shown in FIG. 5.
Figure 11:
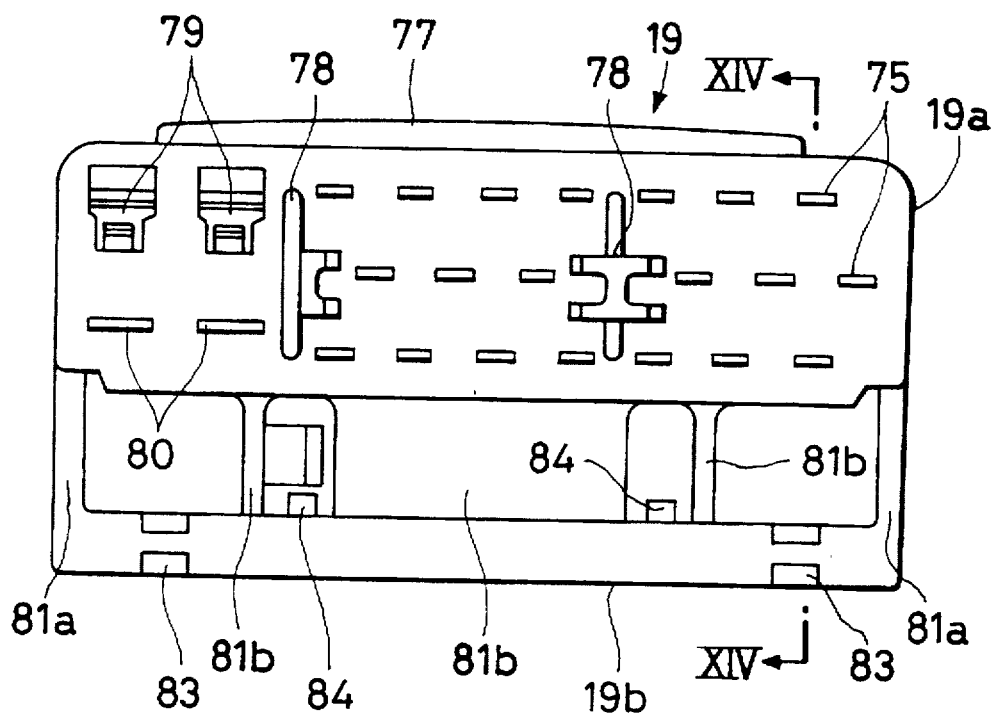
FIG. 11 is a front view of the connector terminal unit.
Figure 12:
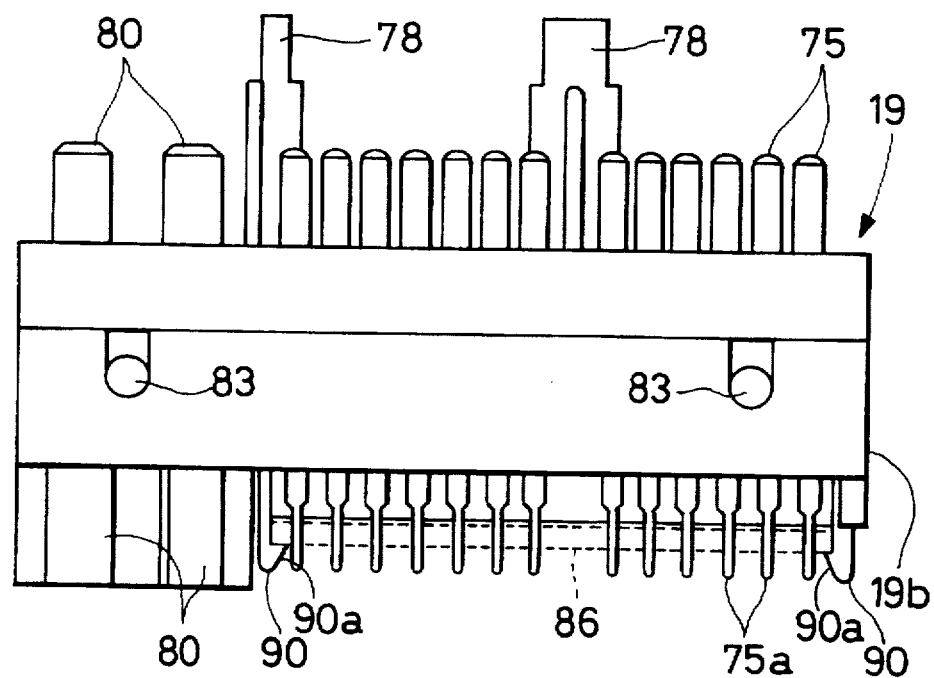
FIG. 12 is a bottom face view of FIG. 11.
Figure 13:
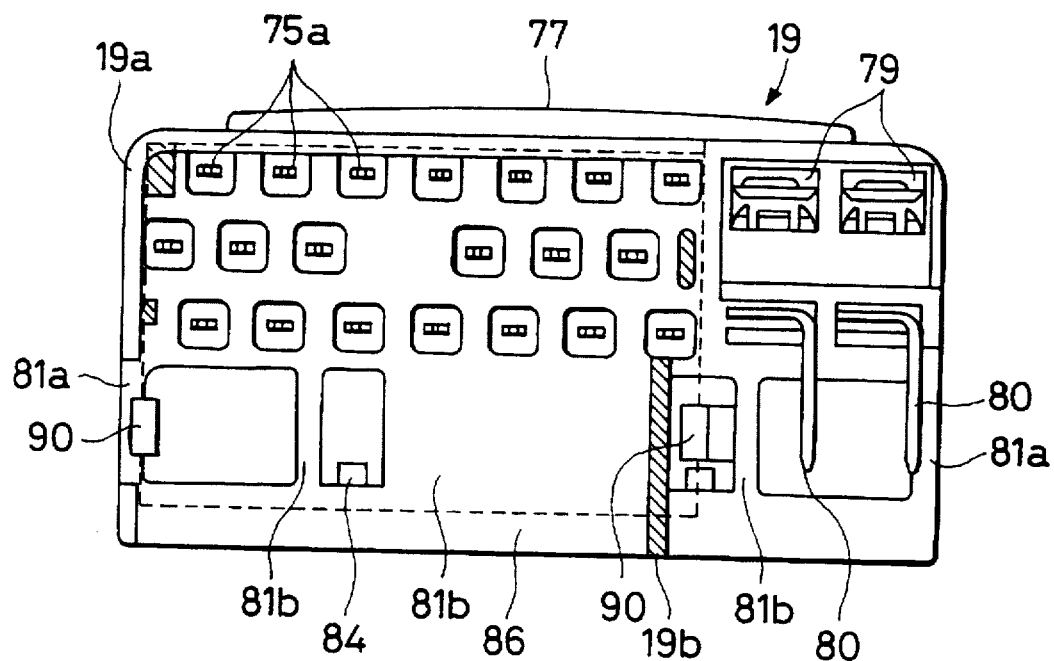
FIG. 13 is a rear side view of FIG. 11.
Figure 14:
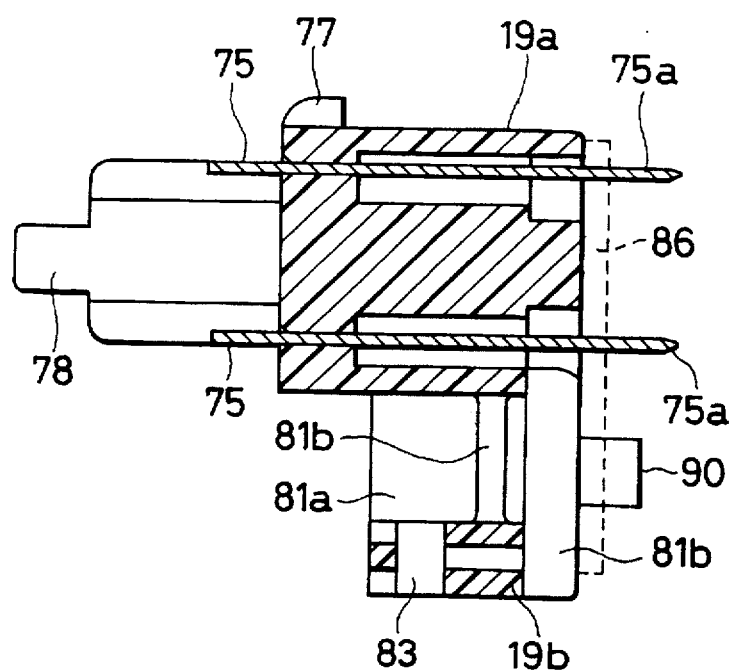
FIG. 14 is a cross-sectional view taken on line XIV—XIV in FIG. 11.

First, an electrical structure of this anti-lock brake system will be explained as follows. As shown in FIG. 10, the rotation of each wheel (not shown) of an automobile is respectively detected by a rotation detecting device 100a to 100d. This detection signal is sent to an electronic control section 6 provided in the electronic control unit 1. In accordance with the detection signal sent from each rotation detecting device 100a to 100d, the electronic control section 6 discriminates whether each wheel tends to lock or not when the brake is applied. According to the result of the discrimination, a solenoid valve 4a to 4d and the motor relay 17, which will be described later, are controlled to be opened and closed.

There is provided a motor 7 on the hydraulic unit 2 side. Electrical power is supplied to the motor 7 from a battery 108 via a contact of a motor relay 17 provided in the electronic control unit 1. When the contact of the motor relay 17 is turned on and off in accordance with a control signal sent from the electronic control section 6, the motor 7 is controlled.

In the electronic control unit 1, there is provided a fail-safe relay 18 for stopping the supply of electrical power to the solenoid valves 4a to 4d when a problem has occurred in the anti-lock brake system.

As shown in the drawings, there are provided a battery 108 installed in the automobile, an ignition switch 109, a stop lamp switch 110 disposed close to the brake pedal, a stop lamp 111 composing a portion of the rear lamp, a warning lamp 112 telling the occurrence of an abnormality of the anti-lock brake system, an earth terminal 120, and rotation detecting devices 100a to 100d. Respective circuits from the above parts to the electronic control unit 1 are composed of one piece of wire harness. At an end of the wire harness, there is provided an external connector 14 (shown in FIG. 5). This external connector 14 is connected with a connector terminal unit 19 provided on the electronic control unit 1 side.

Next, the structure of the electronic control unit integrated with a hydraulic unit in an anti-lock brake system will be explained as follows. As shown in FIGS. 5 to 9, the hydraulic unit 2 controls the pressure of brake fluid of the wheel cylinder of each wheel when four solenoid valves 4a to 4d attached to a rectangular parallelepiped hydraulic housing 3 are opened and closed. Control of opening and closing each solenoid valve 4a to 4d is conducted in accordance with a control signal sent from the electronic control section 6 provided in a case 5 of the electronic control unit 1. In this hydraulic unit 2, on a side of the hydraulic housing 3, there is provided a motor 7, the outer configuration of which is columnar, for driving a plunger pump (not shown) so that the brake fluid can be returned to a master cylinder.

In the hydraulic housing 3, there are provided a plunger pump described before, a flow control valve not shown operated in accordance with the opening and closing of each solenoid valve 4a to 4d, and a brake fluid path. Further, in the hydraulic housing 3, on the upper face, there are provided piping ports 8 for supplying the brake fluid to the wheel cylinders. Furthermore, on the upper face, there are provided piping ports 9 for supplying the brake fluid to the master cylinder.

The case 5 of the electronic control unit 1 is formed flat, and the size of the case 5 is approximately the same as that of the hydraulic unit 2 on a plan view. The case 5 is composed of an upper case 11 made of aluminum by means of die casting and a plate-shaped lower case 12 made of a metallic sheet by means of sheet metal forming.

There is provided a connector housing 11b formed integrally with the aforementioned upper case 11 in such a manner that the connector housing 11b extends upwards, and this connector housing 11b is arranged on both edge portions on the upper face of the upper case 11 and connected with a relay accommodating portion 11a and an external connector 14 for supplying electrical power. This connector housing 11b is further extended to the side. That is, the connector housing 11b is arranged being extended in a clearance formed between the upper face of the upper case 11 and the motor 7. In this connection, there is provided a protrusion 11d which is formed integrally with the connector housing 11b, and this protrusion 11d conducts a cam action together with an auxiliary engaging device 14a of the external connector 14 when it is connected with the external connector 14.

Figure 5:
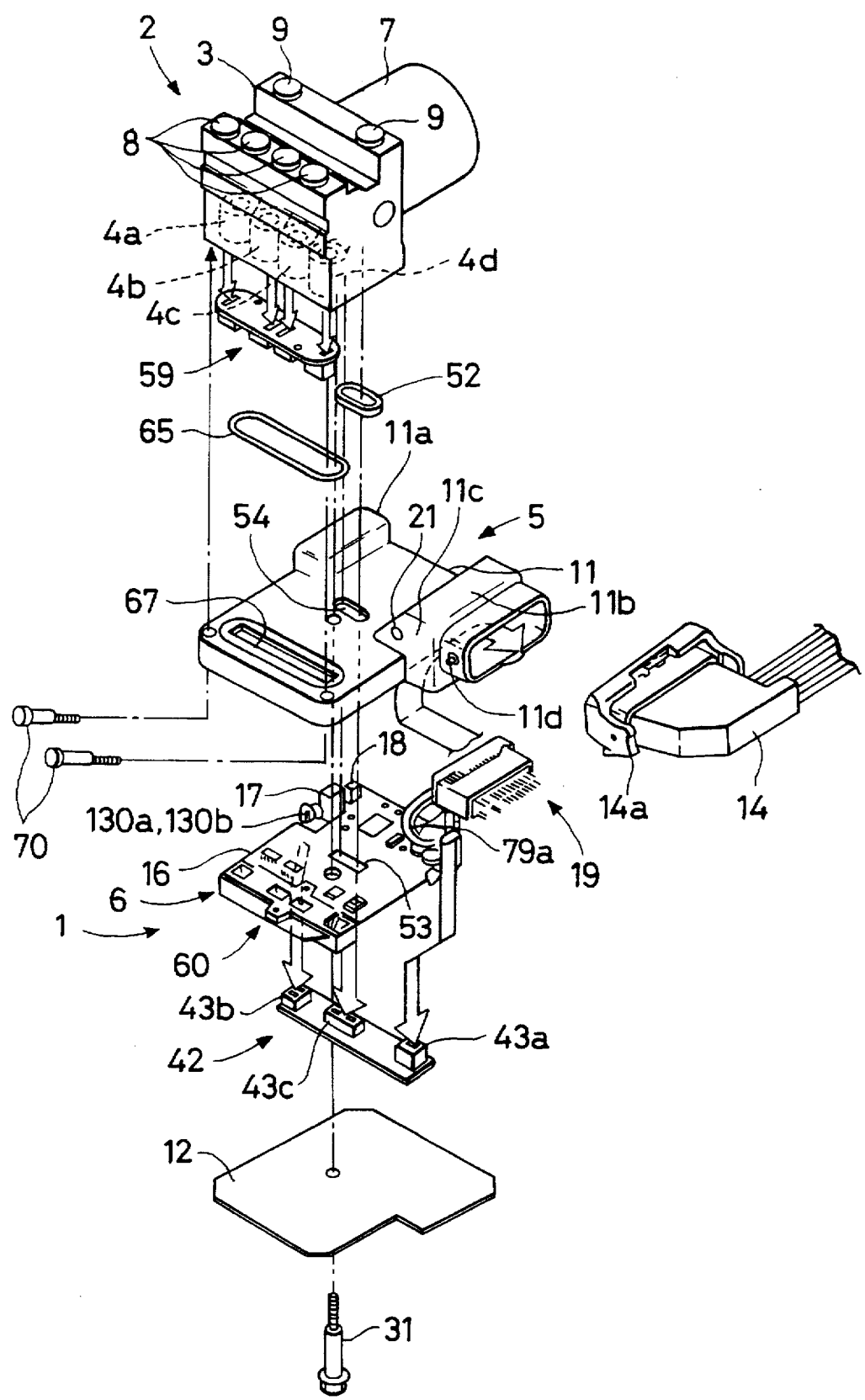
FIG. 5 is an exploded perspective view showing an electronic control unit integrated with a hydraulic unit in an anti-lock brake system of an embodiment of the present invention.
Figure 6:
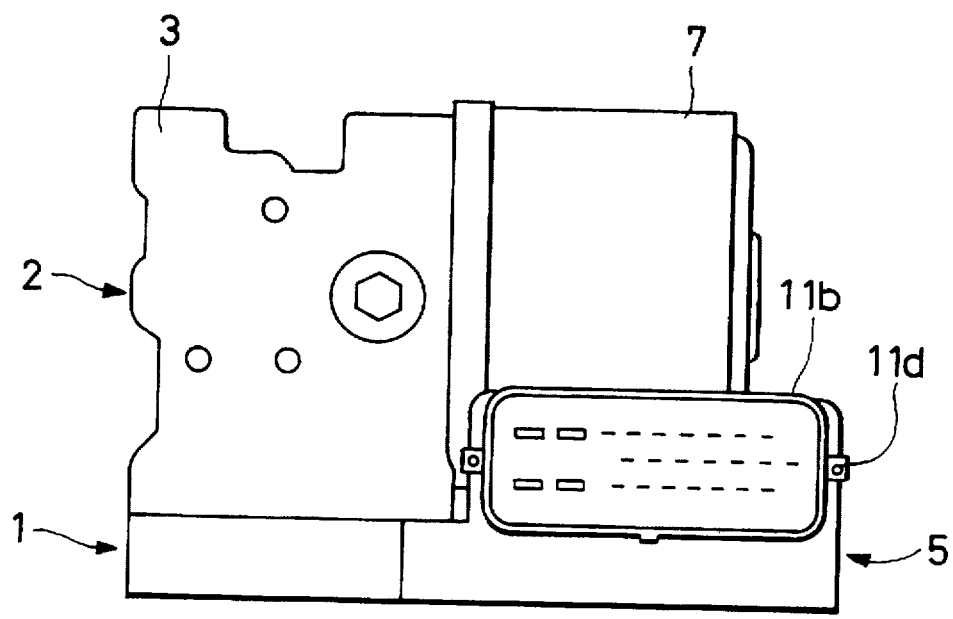
FIG. 6 is a front view showing an assembling condition of the electronic control unit integrated with a hydraulic unit in an anti-lock brake system of an embodiment of the present invention.

In the case 5, there are provided a printed wiring board 16 provided with an appropriate circuit composing the electronic control section 6, a motor relay 17, and a fail-safe relay 18. As shown in FIG. 5, relays 17, 18 are arranged at positions in the relay accommodating portion 11a on the upper case 11. A connector terminal unit 19 connected with the external connector 14 is arranged at a position of the connector housing 11b.

As shown in FIGS. 9, 11, 12, 13 and 14, the connector terminal unit 19 is composed as follows. In the main body 19a of the connector terminal unit 19, there are provided three rows of connector terminals 75 to be connected with the external connector 14, wherein the connector terminals 75 penetrate from the front side to the reverse side of the main body 19a. On the side of the connector terminals 75, there are provided terminals 79 for supplying electrical power to the electronic control section 6, and male terminals 80 for supplying electrical power to the motor 7. The electrical power supply terminal 79 is connected with a lead wire 79a (shown in FIG. 5) on the reverse side of the main body 19a. The other end of this lead wire 79a is electrically connected with the printed wiring board 16. A front end of the male terminal 80 for supplying electrical power to the motor protrudes from the front face of the main body 19a, and a rear end of the male terminal 80 extends downward on the reverse side of the main body 19a and is connected with a connecting portion 43a (shown in FIG. 5) of an electrical connection box 42 described later.

The terminals 75, 79, 80 on the front face of the main body 19a are electrically connected with the respective terminals (not shown in the drawing) in the external connector 14. In this connection, reference numeral 78 is a rib, which is provided for preventing the terminals 75, 79, 80 from being deformed when the external connector 14 is engaged.

At the front end on the upper face side of the main body 19a, there is provided an engaging protrusion 77 which protrudes upward. This engaging protrusion 77 is capable of engaging with an engaging step portion 76 provided on an upper inner circumferential face of the connector housing 11b. On a lower face of the main body 19a, there is integrally provided a box-shaped fixing portion, which is open to the front side, and this a box-shaped fixing portion is composed of a pair of side walls 81a, a rear wall 81b and a bottom plate 19b. At the front end of the bottom plate 19b, there are provided two screw insertion holes 83, and at the front end on the upper face of the bottom plate 19b, there are provided two positioning protrusions 84 in such a manner that the positioning protrusions 84 and the screw insertion holes 83 can not overlap each other.

On both sides of the reverse side of the connector terminal unit 19, there are integrally provided a pair of elastic hooks 90 for holding an auxiliary wiring board 86 described later. Hook portions 90a protrude at ends of both elastic hooks 90 in such a manner that the hook portions 90a are opposed to each other. By the action of the pair of elastic hooks 90, the auxiliary wiring board 86 is pressed against the connector terminal unit 19 from the reverse side so that the auxiliary wiring board 86 can be locked.

Figure 8:
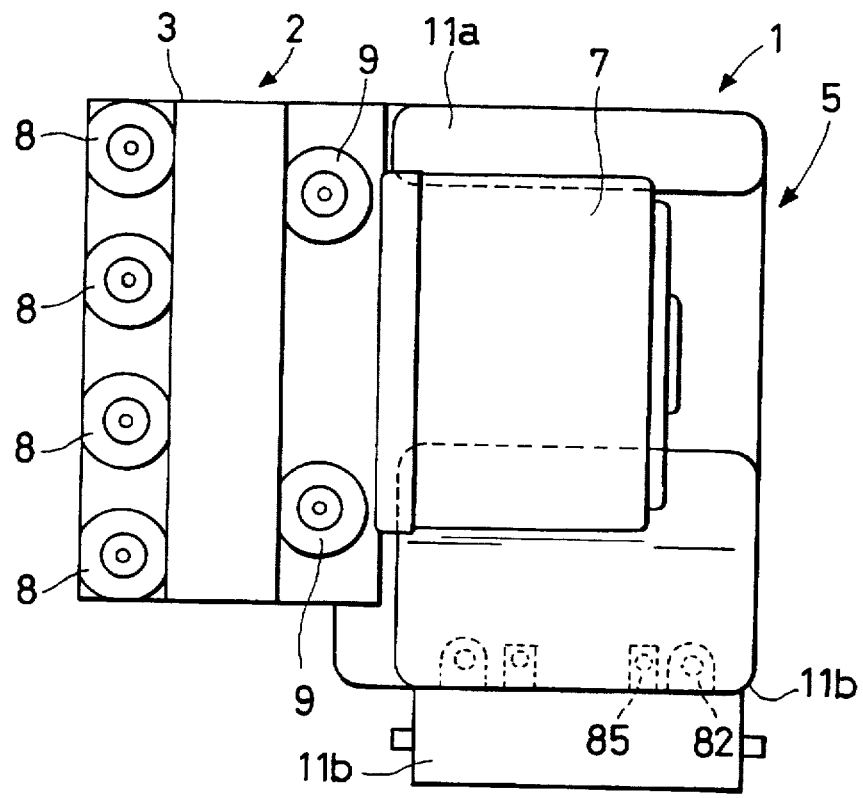
FIG. 8 is a plan view of FIG. 6.
Figure 9:
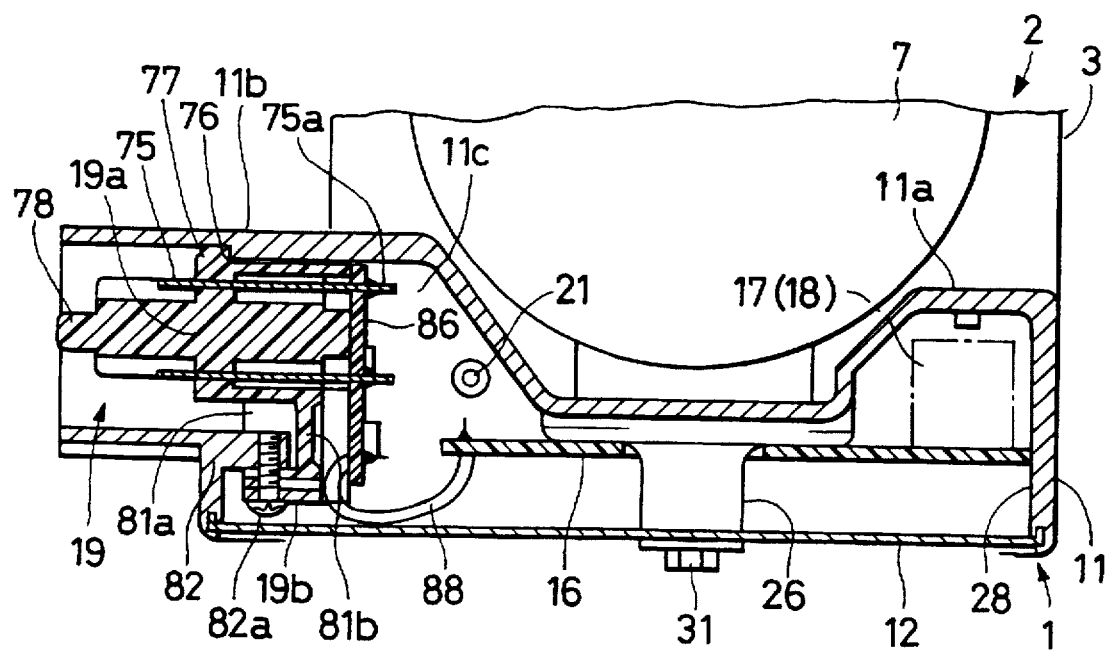
FIG. 9 is a cross-sectional view showing an attaching condition of the connector terminal unit attached to the connector housing.
Figure 19:
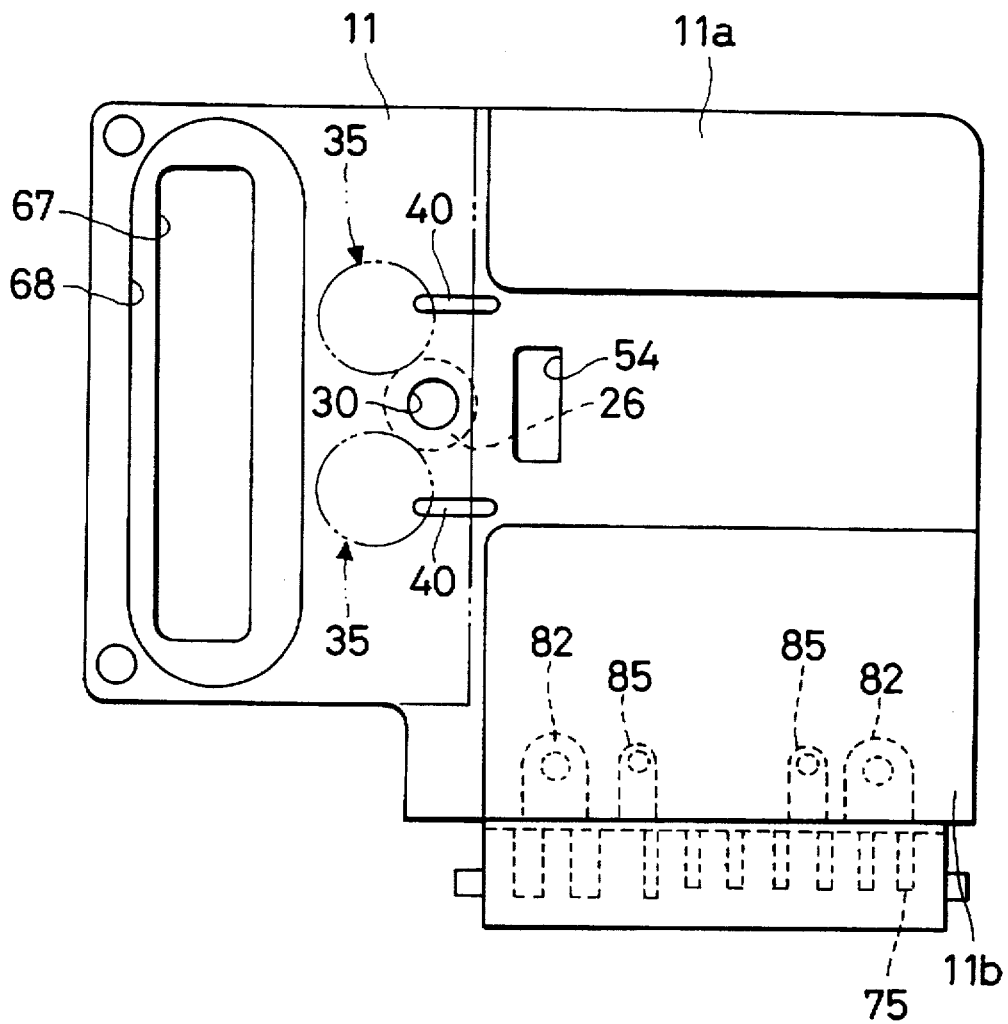
FIG. 19 is a plan view of the upper case.

On the other hand, as shown in FIGS. 8, 9 and 19, in the connector housing 11b, there are provided a pair of attaching pieces 82 having screw holes which protrude backward from the rear end of the lower face on the inner circumferential face, and these attaching pieces 82 are provided at positions corresponding to the pair of screw holes 83 described before. Further, a pair of attaching pieces 85 having positioning holes are provided at positions corresponding to the pair of positioning protrusions 84.

The connector terminal unit 19 composed as described above is attached to the connector housing 11b in the following manner. The connector terminal unit 19 is engaged with the connector housing 11b from the lower inside portion. Under the condition that the engaging protrusion 77 of the connector terminal unit 19 is engaged with the engaging step portion 76 on the connector housing 11b side in the inserting direction of the external connector 14, while the bottom plate 19b is put on the lower side of the attaching pieces 82, 85, the positioning protrusion 84 is inserted into the positioning hole of the attaching piece 85, and at the same time the screw 82a is inserted into the screw insertion hole 83 and screwed to the screw hole of the attaching piece 82. When the screw is fastened as described above, the main body 19a is pressed against the upper face on the inner circumference of the connector housing 11b, so that a contact area of the engaging protrusion 77 with the engaging step portion 76 is increased. Accordingly, the engaging protrusion 77 and the step portion 76 are engaged with each other more positively.

As shown in FIG. 9, the connector terminal 75 of the connector terminal unit 19 is connected with the printed wiring board 16 in the electronic control unit 1 via the auxiliary wiring board 86 and a flat cable such as FPC (flexible printed circuit board) 88.

That is, on the reverse side of the connector terminal unit 19, each connector terminal 75 is arranged extending backward, so that the terminal portion 75a can be formed. This terminal portion 75a is electrically connected with the auxiliary wiring board 86 (shown by dot lines in FIGS. 12, 13 and 14) provided on the reverse side of the connector terminal unit 19 by means of soldering.

Figure 15A:
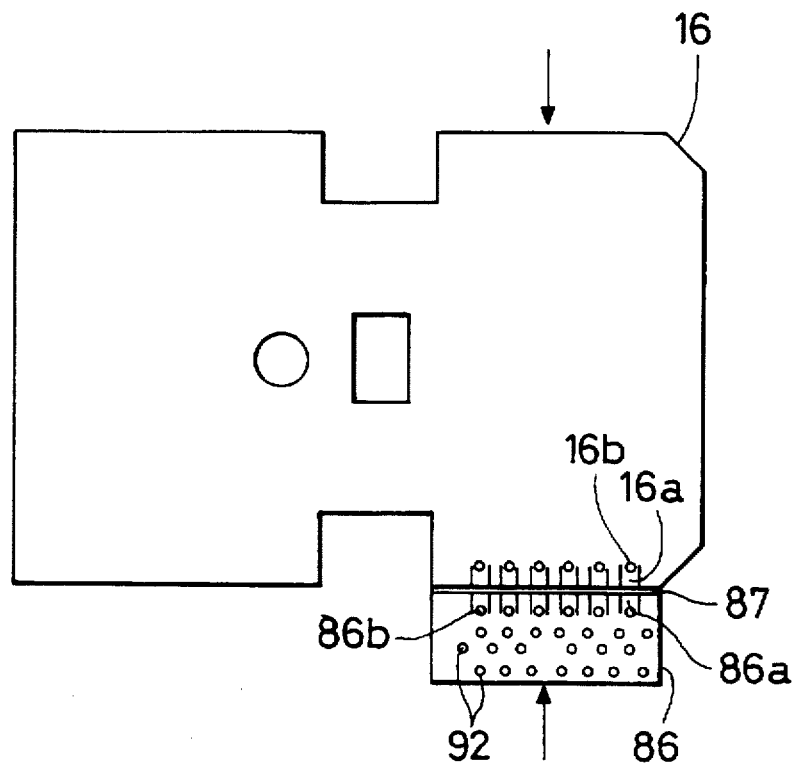
FIGS. 15A and 15B are views showing a printed mounting board and an auxiliary wiring board.
Figure 15B:
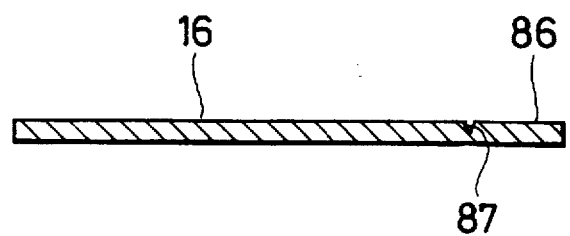
Figure 16A:
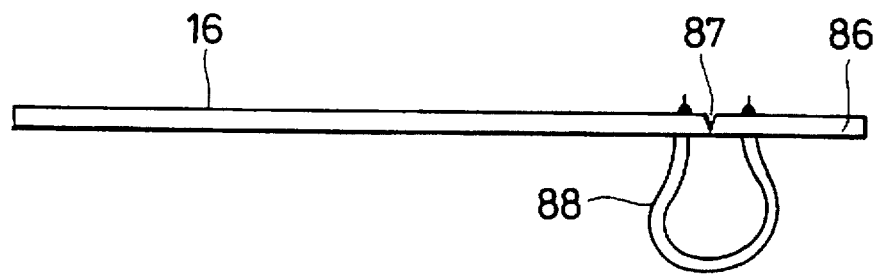
FIGS. 16A, 16B and 16C are views showing a condition of assembling the connecting structure in which a printed mounting board and an auxiliary wiring board are assembled to each other.
Figure 16B:
Figure 16C:
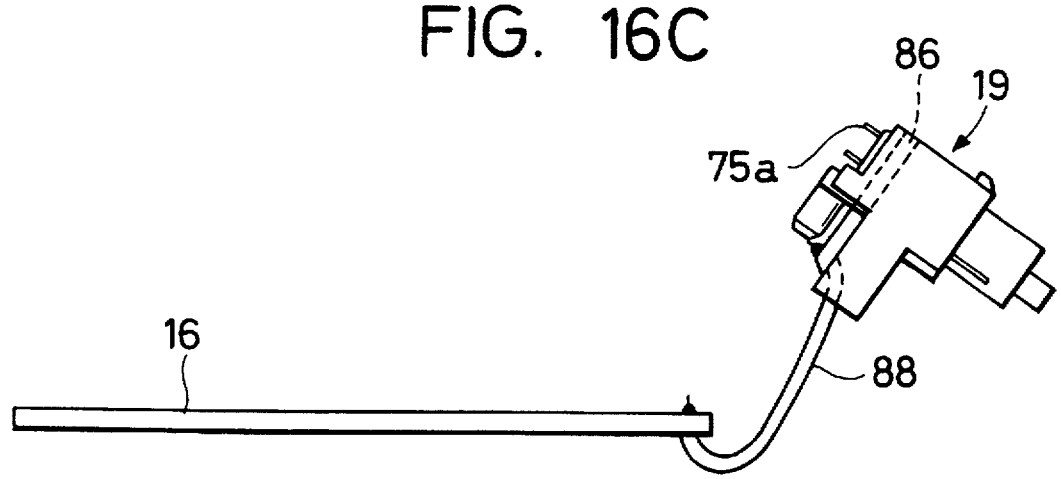

As shown in FIG. 15a, on this auxiliary wiring board 86, there are provided through-holes 92, into which the terminal portion 75a is inserted, and a wiring pattern (not shown). This auxiliary wiring board 86 is integrated with the printed wiring board 16. On the boundary between the printed wiring board 16 and the auxiliary wiring board 86, there is formed a separation groove 87. As shown in FIGS. 16a–c, one end of FPC 88 is made to penetrate the through-hole 16b on the printed wiring board 16 and soldered to the land 16a (shown in FIG. 15a), so that FPC 88 can be electrically connected with the printed wiring board 16. The other end of FPC 88 is soldered to the land 86a (shown in FIG. 15a) on the auxiliary wiring board 86, so that FPC 88 can be electrically connected with the auxiliary wiring board 86. After that, both boards 16, 86 are separated from each other through the separation groove 87. After the separation, while the terminal portion 75a of the connector terminal unit 19 is being inserted into the through-holes 92 on the auxiliary wiring board 86, the auxiliary wiring board 86 is pressed against a contact face (a hatched portion in FIG. 13) on the reverse side of the main body 19a of the connector terminal unit 19, and both ends of the auxiliary wiring board 86 are held by a pair of elastic hooks 90 protruding onto the reverse side of the connector terminal unit 19. Under the above condition, the terminal portion 75a is soldered onto the auxiliary wiring board 86.

As described above, after the connector terminal unit 19 and the printed wiring board 16 have been electrically connected with the auxiliary wiring board 86 and FPC 88, the connector terminal unit 19 is attached to the connector housing 11b, and the printed wiring board 16 is assembled into the case 5.

Figure 17:
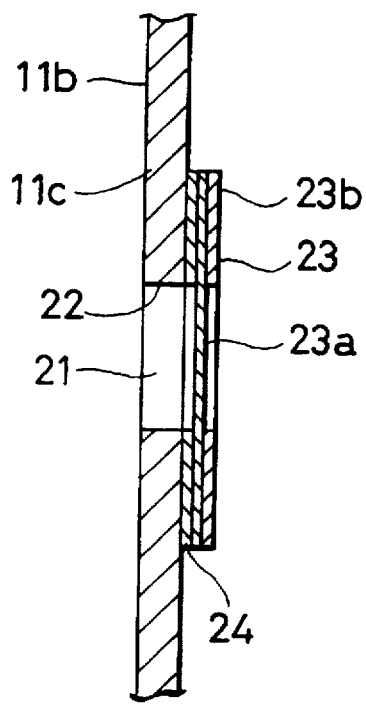
FIG. 17 is an enlarged cross-sectional view showing a ventilating hole portion.

On the wall 11c of the connector housing 11b arranged in the upward and downward direction, which is a case wall face opposed to the hydraulic housing 3, as shown in FIGS. 5, 9 and 17, there is provided a small ventilation hole portion 21. This ventilation hole portion 21 includes: a hole portion 22 formed on the wall portion 11c; and a film body 23 having air-permeability attached inside the hole portion 22 so that the hole portion 22 can be closed by the film body 23. The film body 23 having air-permeability is mainly composed of a thin film 23a made of Teflon having a large number of minute holes, the diameter of which is 4μ to 10μ, so that water can not permeate through the film body 23. Around the outer circumference of the ventilation film body 23, there is provided a holding frame 23b made of polypropylene or polyester, wherein the holding frame 23b is attached to the ventilation film body 23 by the application of heat and force.

This ventilation film body 23 is attached to the inside of the hole portion 22 with an adhesive double coated tape 24. Therefore, the ventilation hole portion 21 has air-permeability, however, no water permeates through the ventilation hole portion 21.

Figure 18:
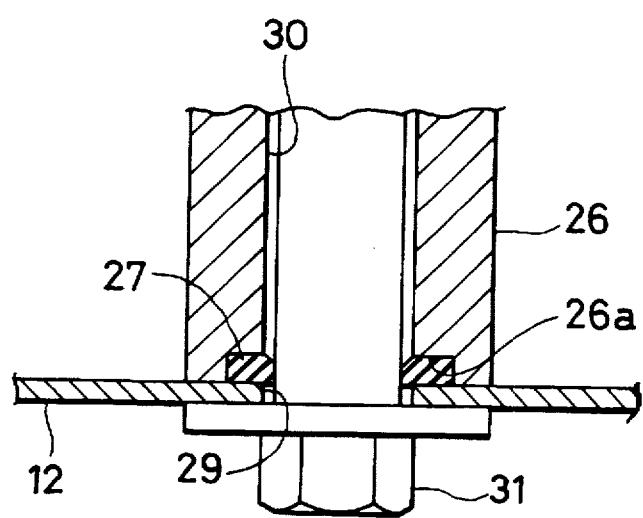
FIG. 18 is a cross-sectional view showing a primary portion of the bolt inserting cylindrical portion.

As shown in FIGS. 9, 18 and 19, on the lower face at the center of the upper case 11, there is provided a bolt insertion cylindrical portion 26 which extends to the lower case 12. Along the inner circumferential edge of the lower end of the bolt insertion cylindrical portion 26, there is provided a seal step portion 26a.

An O-ring 27 is attached to the seal step portion 26a, and the lower case 12 is attached to the upper case 11 in such a manner that the lower opening 28 of the upper case 11 is closed by the lower case 12. A bolt 31 having a flange is inserted into a bolt insertion hole 29 on the lower case 12 side and a bolt insertion hole 30 on the upper case 11 side. When the bolt 31 having a flange is screwed to the hydraulic housing 3 in this way, the electronic control unit 1 and the hydraulic unit 2 are integrated with each other.

In this case, the bolt insertion cylindrical portion 26 is sealed from the lower case 12 by the O-ring 27.

As shown in FIGS. 9 and 20 to 22, along the inner circumferential edge of the lower opening 28 of the upper case 11, there is provided a seal step portion 32 with which the lower case 12 is engaged. In the seal step portion 32, there is formed a seal groove 32a in the circumferential direction.

Figure 20:
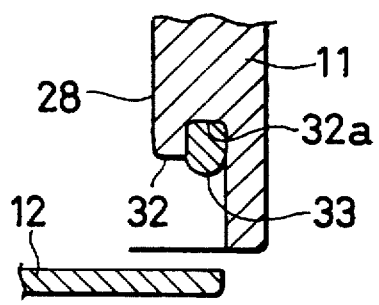
FIG. 20 is a schematic illustration showing a primary portion of the caulking work in which the upper case is caulked to the lower case.
Figure 21:
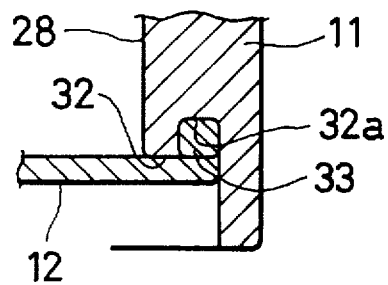
FIG. 21 is a schematic illustration showing a primary portion of the caulking work in which the upper case is caulked to the lower case.
Figure 22:
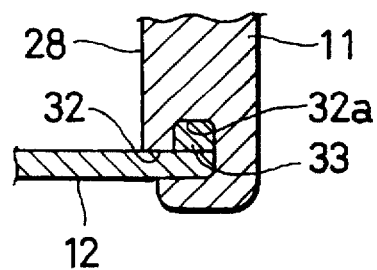
FIG. 22 is a schematic illustration showing a primary portion of the caulking work in which the upper case is caulked to the lower case.

As shown in FIG. 20, under the condition that the seal groove 32a is filled with an adhesive sealing agent 33, the lower case 12 is engaged with the seal step portion 32 as shown in FIG. 21, and the lower edge portion of the lower opening 28 of the upper case 11 is caulked at regular intervals at a plurality of positions. In this way, the lower case 12 is caulked to the upper case 11 by means of caulking as shown in FIG. 22. Due to this caulking connection, the sealing agent 33 adheres onto both the upper 11 and the lower case 12, so that both cases can be closely connected with each other and sealed.

Figure 23:
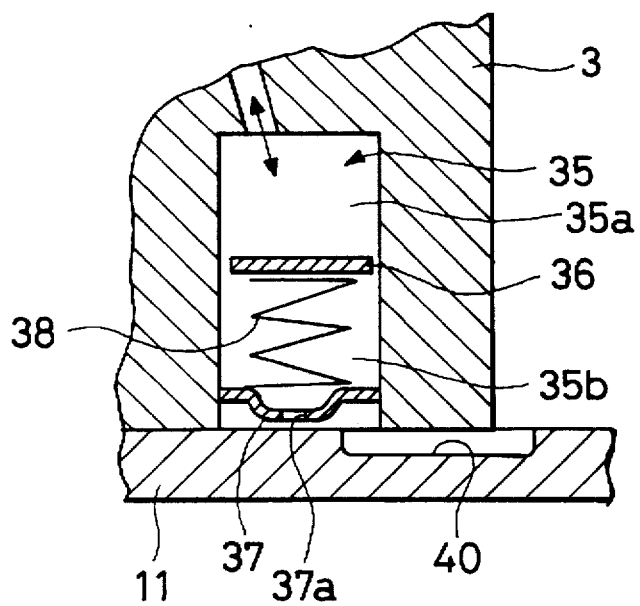
FIG. 23 is a cross-sectional view showing a primary portion of the buffer chamber.

As shown in FIGS. 19 and 23, in the hydraulic housing 3, there are provided a pair of buffer chambers 35 in which brake fluid is temporarily stored in the anti-lock brake operation. The buffer chamber 35 includes: a brake fluid storing chamber 35a into which brake fluid flows; and a chamber 35b in which no brake fluid is stored which is located on the opposite side of the brake fluid storing chamber 35a being partitioned by a piston 36. The chamber 35b in which no brake fluid is stored faces the lower face of the hydraulic housing 3. In the lower portion of the chamber 35b in which no brake fluid is stored, there is provided a cover 37 having a ventilation hole 37a. Also, there is provided a return spring 38 between the piston 36 and the cover 37.

In order to communicate the chamber 35b in which no brake fluid is stored, with the outside air when the electronic control unit 1 is connected with the hydraulic unit 2, on the upper face of the upper case 11, there is formed a communication groove 40 which communicates the buffer chamber 35 with the outside of the hydraulic housing 3.

In FIGS. 5, 24a, 24B and 25, reference numeral 42 is an electrical connection box composing an electrical power circuit for supplying electrical power to the motor 7, and a high intensity of electrical current flows in the electrical connection box. The electrical connection box 42 includes a bus bar holding case 43 made of resin. On one side of the bus bar holding case 43, there is provided a connector side connecting portion 43a with which a male terminal 80 (shown in FIG. 33) of the connector terminal unit 19 for supplying electrical power to the motor, is connected. On the other side of the bus bar holding case 43, there is provided a relay side connecting portion 43b with which male terminals 130a, 130b (shown in FIG. 33) for the motor relay on the motor relay 17 side are connected. At the center, there is provided a motor side connecting portion 43c with which a male terminal 45 (shown in FIG. 33) for supplying electrical power to the motor 7 is connected.

In the bus bar holding case 43, there are provided connecting portions 43a, 43b, 43c which are aligned on the same straight line. In each connecting portion, there is provided a relay terminal 46, in the upper and lower portions of which female connecting portions 46a are attached. In the direction in which the relay terminals 46 are arranged, long-plate-shaped bus bars 47, 48, 49 are disposed. At both end portions of the bus bars, there are provided male terminals 47a, 48a, 49a which protrude upward. These male terminals 47a, 48a, 49a are inserted into and connected with the lower side of the corresponding lower side female connecting portions 46a of the relay terminals 46.

Figure 25:
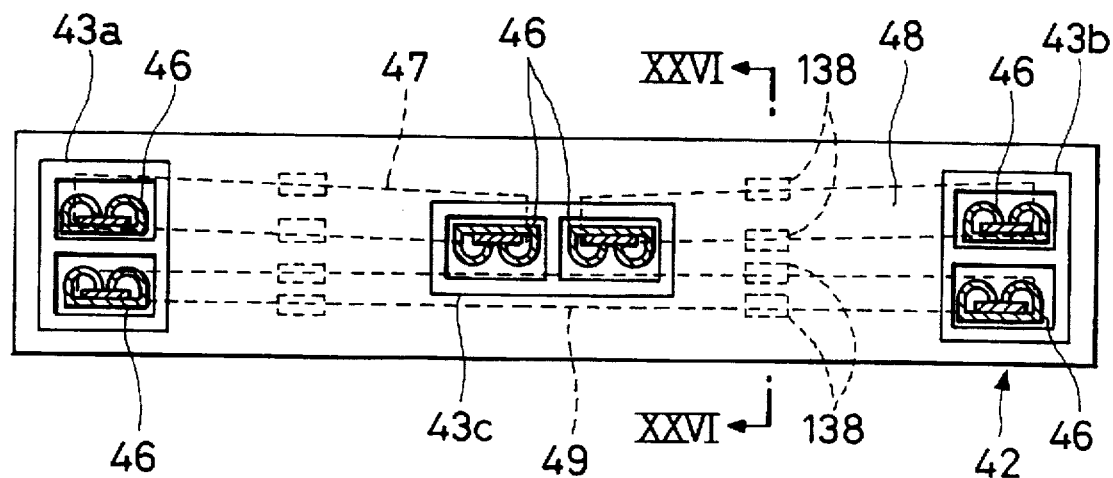
FIG. 25 is a front view of the electrical connection box.
Figure 26:
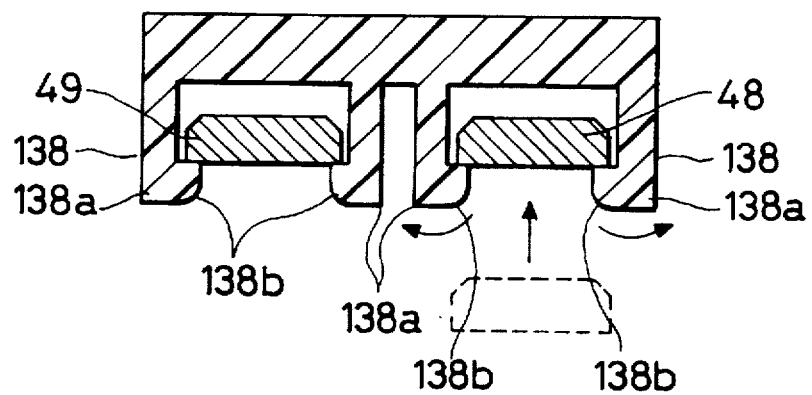
FIG. 26 is a cross-sectional view taken on line XXVI—XXVI in FIG. 25.

As shown in FIGS. 25 and 26, these bus bars 47, 48, 49 are respectively fixed to bus bar holding portions 138 provided on the lower side of the bus bar holding case 43. That is, at the ends of a pair of bus bar holding portions 138, there are provided a pair of engaging protrusions 138a having a pair of guide faces 138b, the interval of which is gradually reduced in the inward direction. Both sides on the upper faces of the bus bars 47, 48, 49 are chamfered. When the bus bars 47, 48, 49 are inserted while they are being pressed against the guide faces 138b of the bus bar holding portion 138, the bus bar holding portion 138 is uniformly extended outside and returned elastically, and then the bus bars 47, 48, 49 are accommodated inside the bus bar holding portion 138.

Figure 27:
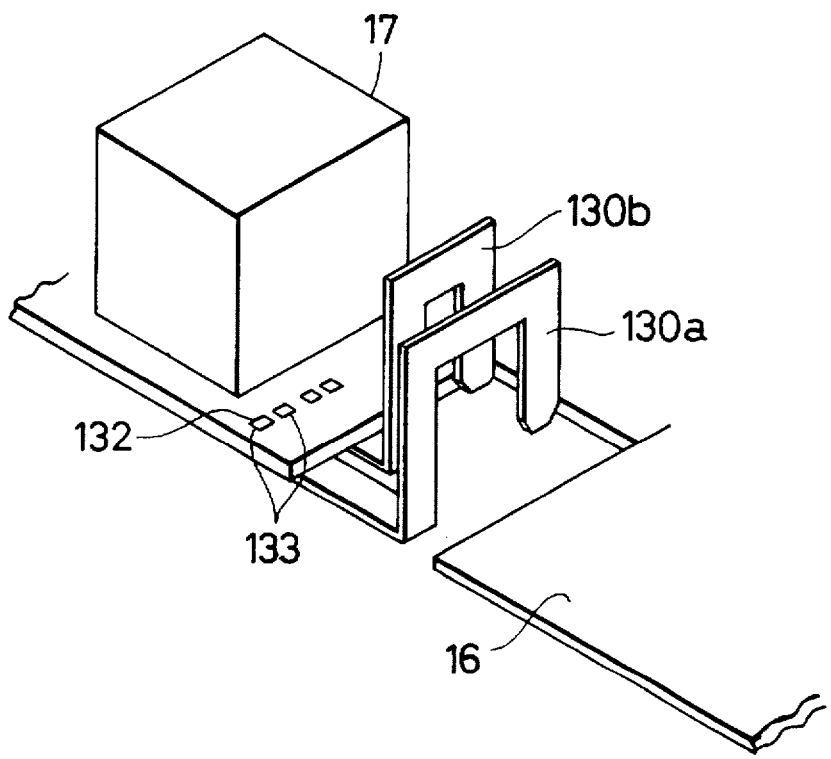
FIG. 27 is a perspective view showing a connecting condition of the motor relay and the male terminal used for the motor relay.
Figure 28:
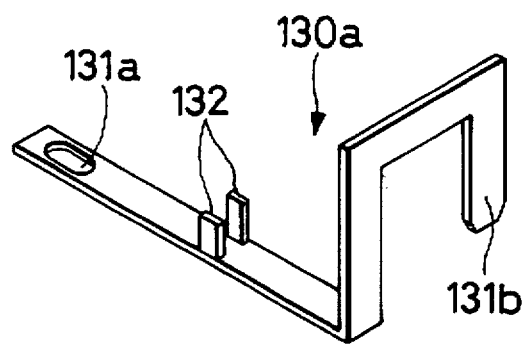
FIG. 28 is a perspective view of the male terminal used for the motor relay.

As shown in FIGS. 27 and 28, concerning the motor relay 17 mounted on the front face side of the printed wiring board 16 in the electronic control unit 1, a coil side terminal (not shown) of the motor relay 17 is connected with the wiring pattern on the printed wiring board 16, and a contact side terminal (not shown) of the motor relay 17 is connected with the male terminals 130a, 130b for the motor relay in the following manner. The male terminal 130a for the motor relay is made of a thin metallic sheet by means of punching and bending, and a relay terminal insertion hole 131a into which the contact side terminal of the motor relay 17 is inserted is provided at the base end of the male terminal 130a for the motor relay, and the fore end of the male terminal 130a for the motor relay is formed into a C-shape. As shown in FIG. 28, the fore end 131b is extended downward and connected with the electrical connection box 42. Further, there are provided a pair of holding pieces 132 in the intermediate portion between the base end portion and the fore end portion.

Under the condition that the base end of the male terminal 130a of the motor relay described above is arranged on the lower face of the printed wiring board 16, the contact side terminals of the motor relay 17 are inserted into the terminal insertion hole (not shown) on the printed wiring board 16 and the relay terminal insertion hole 131a, and the contact side terminals of the motor relay 17 are soldered to the male terminals 130a for the motor relay on the lower face of the printed wiring board 16. At this time, the holding pieces 132 of the male terminal 130a for the motor relay penetrate a pair of holding holes 133 provided on the printed wiring board 16, and upper ends of the holding pieces 132 are bent onto the upper face of the printed wiring board 16. Due to the foregoing, the male terminal 130a for the motor relay can be fixed onto the printed wiring board 16. In this connection, the male terminal 130b is arranged substantially in the same manner and electrically connected with the other contact side terminal of the motor relay 17.

Figure 29:
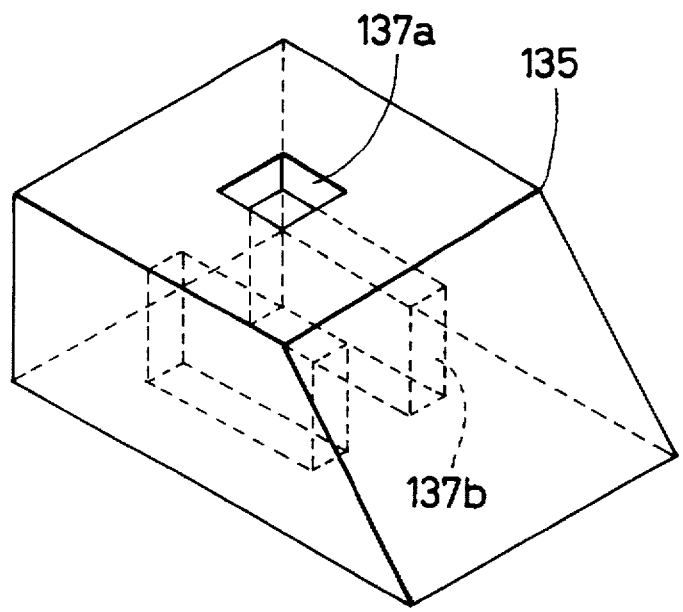
FIG. 29 is a perspective view of the insulating spacer.

An insulating spacer 135 shown in FIG. 29 is interposed between the male terminals 130a, 130b for the motor relay and the case 5 so that the electrical circuit of the anti-lock brake system can not be short-circuited when the C-shaped portions of the male terminals 130a, 130b for the motor relay come into contact with the case 5 of the electronic control unit 1 made of aluminum. This insulating spacer 135 is formed into a trapezoidal block shape having a tapered face which is formed in accordance with an inner face of the relay accommodating portion 11a (shown in FIG. 9) of the case 5. A hole 137a formed on the upper face of the insulating spacer 135 is engaged with a protrusion 136 (shown in FIG. 33) formed on the inner circumferential face of the relay accommodating portion 11a. Further, a pair of relay terminal engaging recesses 137b formed on the lower face of the insulating spacer 135 are engaged with the C-shaped portions of the male terminals 130a, 130b for the motor relay.

Figure 30:
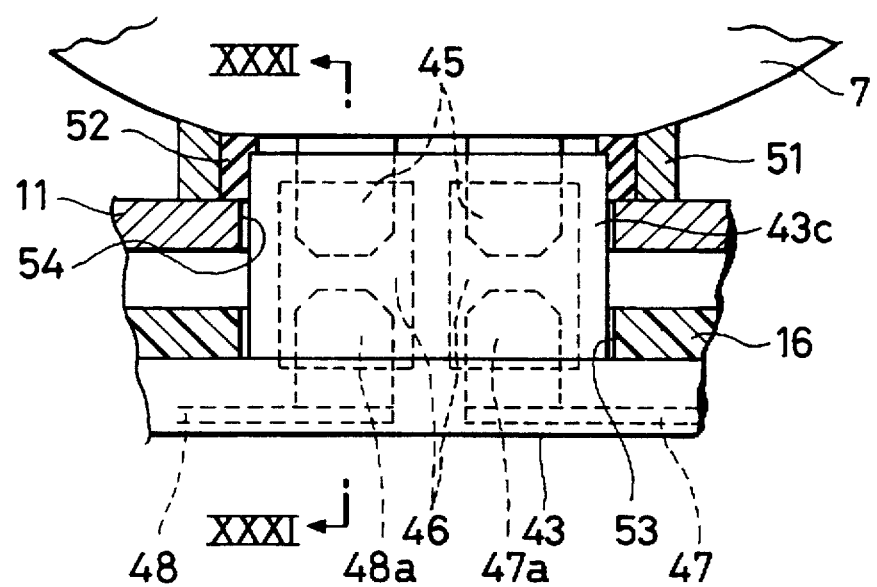
FIG. 30 is a schematic illustration showing an electrical connecting portion of the motor side and the electronic control unit side.
Figure 31:
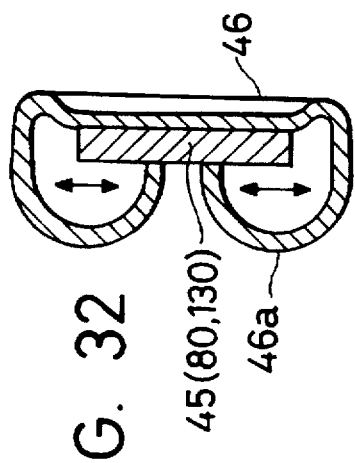
FIG. 31 is a cross-sectional view taken on line XXXI—XXXI in FIG. 30.

As shown in FIG. 30, in the lower portion of the motor 7, there are provided male terminals 45 for feeding electrical power to the motor in such a manner that the male terminals 45 protrude downward. There is protruded an annular wall 51 which surrounds the outer circumference of the male terminals 45 for feeding electrical power to the motor. Under the condition that an O-ring 52 is attached along the annular wall 51, a motor side connecting portion 43c of the electrical connection box 42 is inserted into the annular wall 51 via an insertion hole 53 on the printed wiring board 16 and an insertion hole 54 of the upper case 11. Therefore, when the electronic control unit 1 is integrated with the hydraulic unit 2, the male terminals 45 for feeding electrical power to the motor can be connected with the female connecting portions 46a on the upper side of the relay terminal 46. In this connecting condition, the O-ring 52 is attached with pressure onto the upper face of the upper case 11, so that the annular wall 51 and the upper case 11 are sealed from each other.

Figure 33:
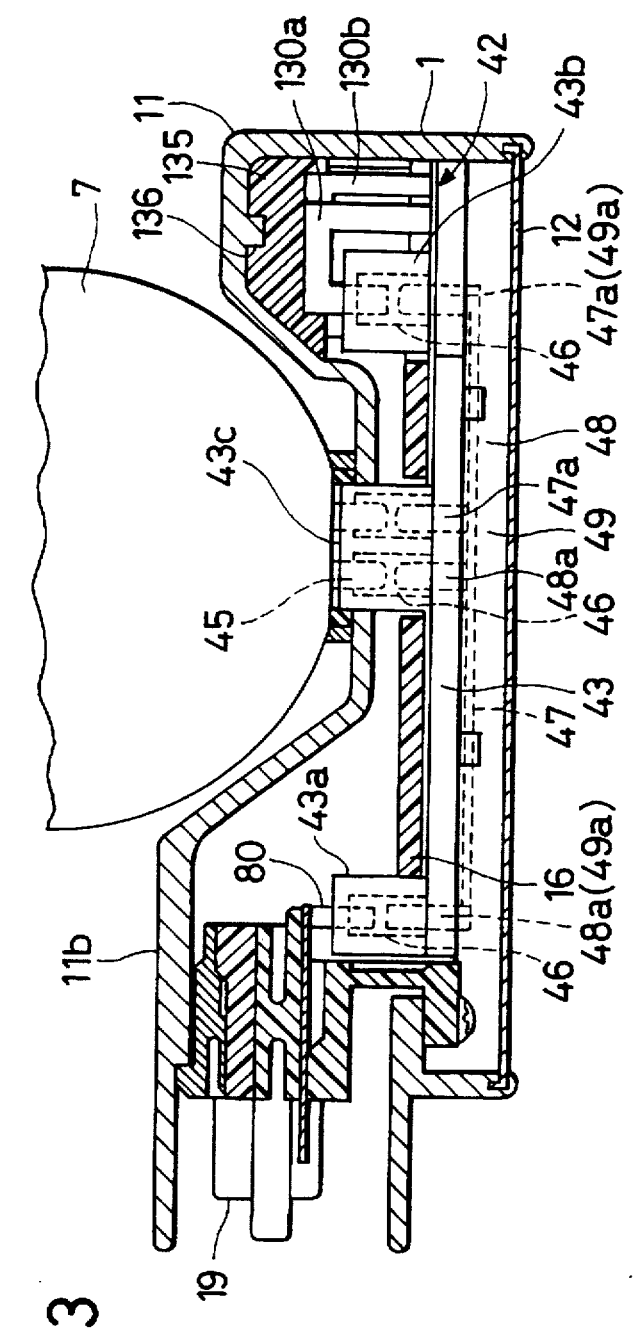
FIG. 33 is a schematic illustration showing a connecting condition of each male terminal and the electrical connection box.

As shown in FIG. 33, the male terminal 45 for feeding electrical power to the motor 7, the male terminal 80 for supplying electrical power source to the motor of the connector terminal unit 19 and the male terminal 130 for the motor relay are aligned on the same straight line, so that they are electrically connected with each other through the relay terminal 46 and the bus bars 47, 48, 49. In this way, there is formed an electrical circuit for supplying electrical power source to the motor which is composed of a male terminal 80 for supplying electrical power source to the motor, bus bar 49, male terminal 130b for the motor relay, motor relay 17, male terminal 130a for the motor relay, bus bar 48, male terminal 45 for feeding electrical power to the motor, motor 7, male terminal 45 for feeding electrical power to the motor, bus bar 47, and male terminal 80 for supplying electrical power source to the motor.

Figure 32:
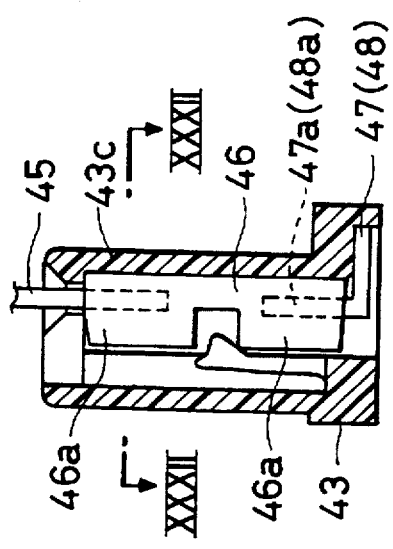
FIG. 32 is a cross-sectional view taken on line XXXII—XXXII in FIG. 31 which shows a connecting condition of the male terminal and the female connecting portion in FIG. 31.

In this case, as shown in FIG. 32, the width direction on the fore end side of each male terminal 45, 80, 130a, 130b is aligned with the arrangement direction of each male terminal 45, 80, and each male terminal is pressed against and held by the relay terminal 46 so that it can freely slide in the width direction.

Figure 34:
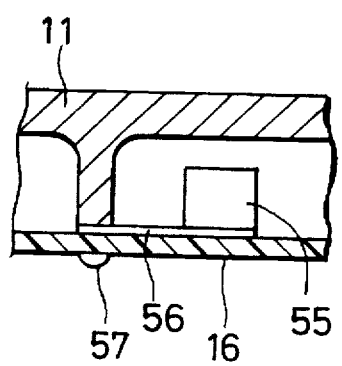
FIG. 34 is a cross-sectional view showing a primary portion of the attaching condition in which the heat generating parts are attached.
Figure 35:
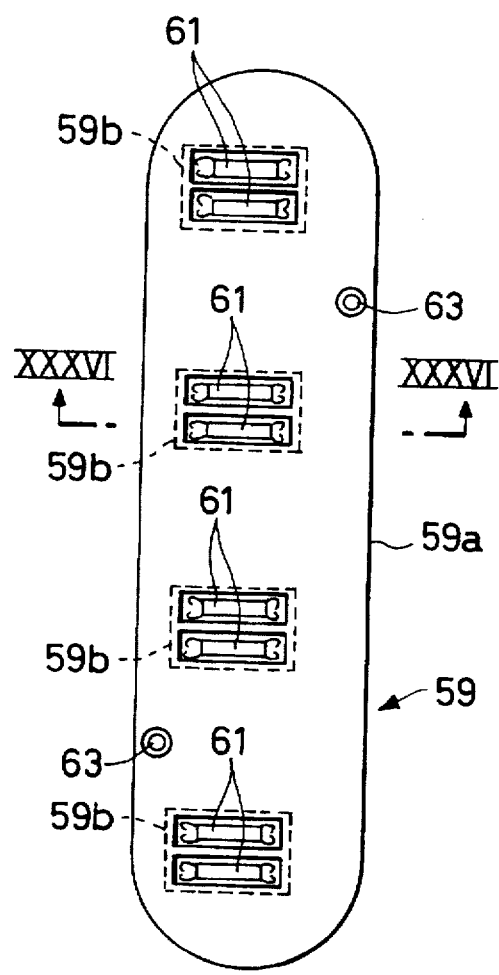
FIG. 35 is a plan view of the solenoid connector.

FIG. 34 is a view showing the attaching structure of a heat generating member 55 such as a regulator and a converter mounted on the printed wiring board 16. On the printed wiring board 16, there is provided a conductive portion 56, and the heat generating member 55 is mounted, coming into contact with the conductive portion 56. The printed wiring board 16 is fixed to the upper case 11 by screws 57 while the conductive portion 56 comes into contact with the upper case 11.

Figure 36:
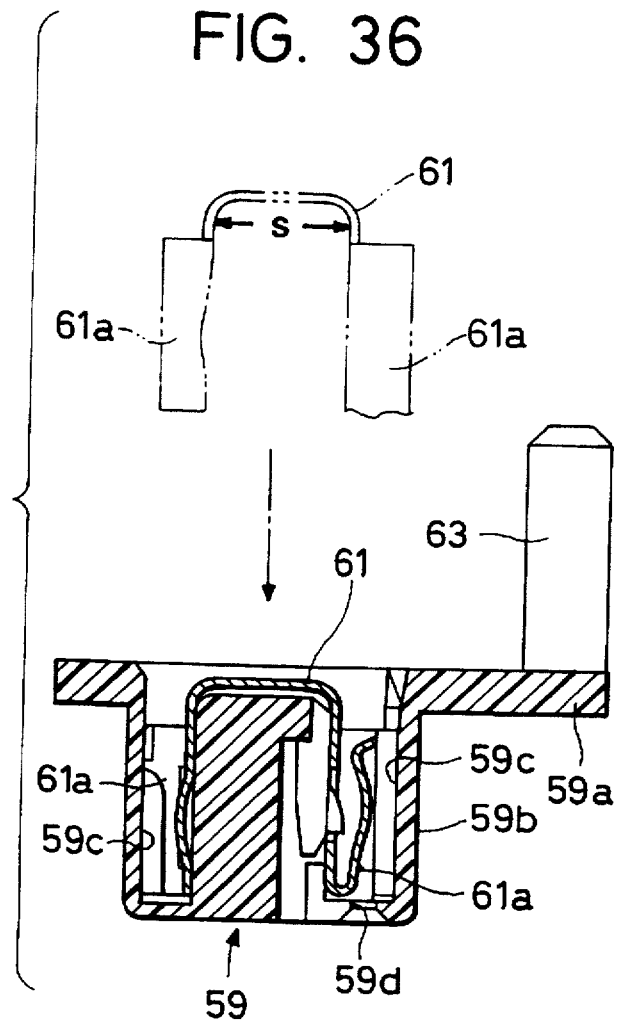
FIG. 36 is a cross-sectional view taken on line XXXVI—XXXVI in FIG. 35.
Figure 37:
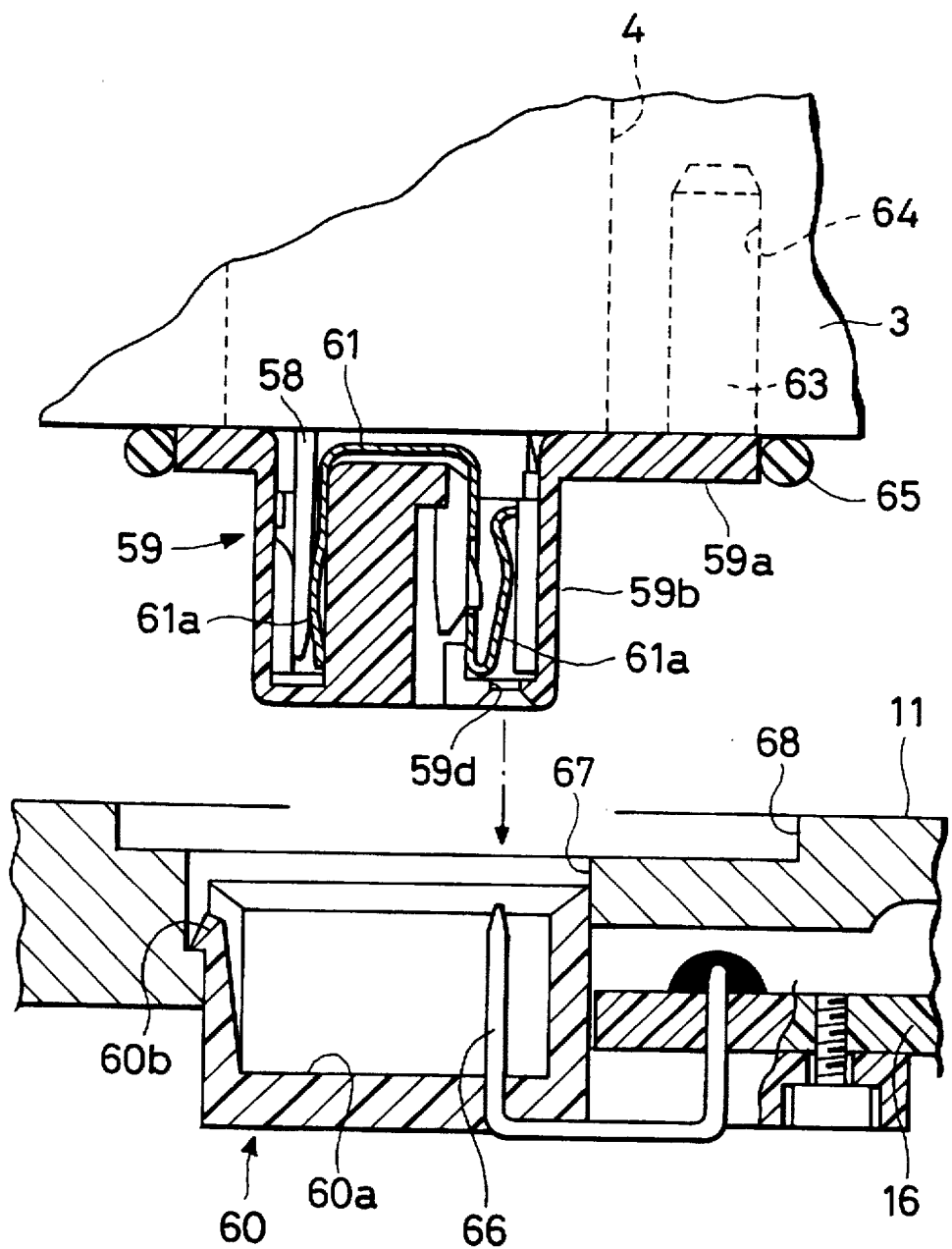
FIG. 37 is a cross-sectional view showing the solenoid connector and the solenoid connector connecting portion which are in a connecting operation.

Each solenoid valve 4a to 4d provided in the hydraulic housing 3 has a pair of male connecting terminals 58 protruding downward from the lower face of the hydraulic housing 3 (shown in FIG. 37). The solenoid valves 4a to 4d are respectively connected with the solenoid connectors 59 shown in FIGS. 5 and 35 to 37. The solenoid connectors 59 are connected with the solenoid connector connecting portion 60 arranged at one end of the printed wiring board 16 (shown in FIGS. 5 and 37).

The solenoid connector 59 includes: a flat flange base portion 59a made of synthetic resin; and four solenoid connecting portions 59b protruding downward corresponding to the solenoid valves 4. In each solenoid connecting portion 59b, there are provided a pair of relay terminals 61 being locked.

As shown in FIGS. 36 and 37, each female—female relay terminal 61 includes: female connecting portions 61a arranged on both end portions; and an intermediate linking portion 61b for linking both female connecting portions 61a, wherein the intermediate portion is bent so that the female—female relay terminal 61 is formed into a substantial U-shape. The female connecting portions 61a on both sides are accommodated in the respective terminal accommodating recesses 59c of the solenoid connecting portion 59b from the upper side, and under the condition that a small clearance is formed between the linking portion 61b and the female solenoid connector 59 in the upward and downward direction, one of the female connecting portions 61a is engaged with the engaging portion 59a being locked. In this case, the female—female relay terminal 61 is accommodated in and held by the female solenoid connector 59 being locked under the condition that the female connecting portion 61a is allowed to slightly move in the upper and lower direction.

One of the female connecting portions 61a is capable of being connected with the male terminal 58 of the solenoid coil of the solenoid valve 4 in such a manner that the male terminal 58 is inserted into one of the female connecting portions 61a from the upper position. The other female connecting portion 61a is capable of being connected with the male terminal 66 (shown in FIG. 37) described later in such a manner that male terminal 66 is inserted into the female connecting portion 61a from the lower position via the terminal insertion hole 59d formed on the lower face of the solenoid connecting portion 59b.

In this case, the female connecting portion 61a with which the male terminal 58 on the solenoid coil side is connected is formed into a faston-shape, the contact pressure of which is high, and the female connecting portion 61a with which the male terminal 66 on the electronic control unit 1 side is connected is formed into a tongue-shape. The female connecting portion 61a on the male terminal 66 connection side is engaged with and fixed to the male terminal. The female connecting portion 61a on the other male terminal 58 connection side is not fixed but put in a condition in which the female connecting portion 61a can be moved in the upward and downward direction. Length S (shown in FIG. 36) of the linking portion 61b to link both the female connecting portions 61a is determined to be an appropriate value so that the female connecting portion 61a with which the other male terminal 66 is connected can not be moved even when the male terminal 58 on the solenoid coil side connected with the female connecting portion 61a is moved in the upward and downward direction.

On the upper face of the flange base portion 59a, there are provided a pair of positioning pins 63 which protrude upward. As shown in FIG. 37, when each positioning pin 63 is engaged with the corresponding positioning hole, 64 formed on the lower face of the hydraulic housing 3, the solenoid connector 59 can be positioned with respect to the hydraulic housing 3, and at the same time, each male terminal 58 of each solenoid valve 4 can be connected with the female connecting portion 61a of the relay terminal 61 accommodated in each solenoid connecting portion 59b.

In the outer circumferential edge portion of the flange base portion 59a, there is provided a guide composed of a rubber ring 65. As shown in FIG. 37, when the rubber ring 65 is attached to the outer circumferential edge portion of the flange base portion 59a, the rubber ring 65 can be arranged at a predetermined position on the lower face of the hydraulic housing 3.

Figure 38:
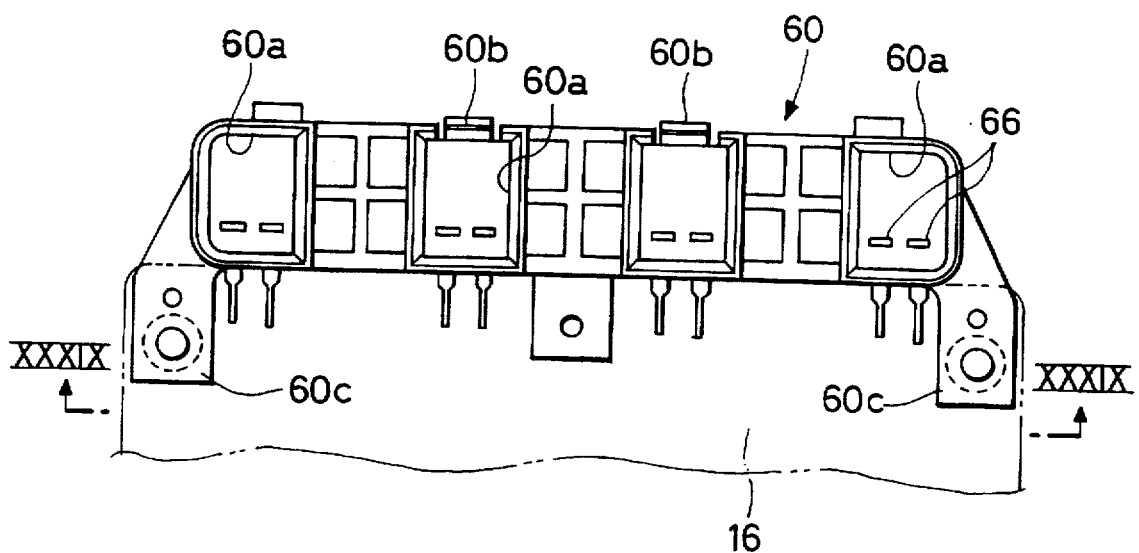
FIG. 38 is a plan view of the solenoid connector connecting portion.
Figure 39:
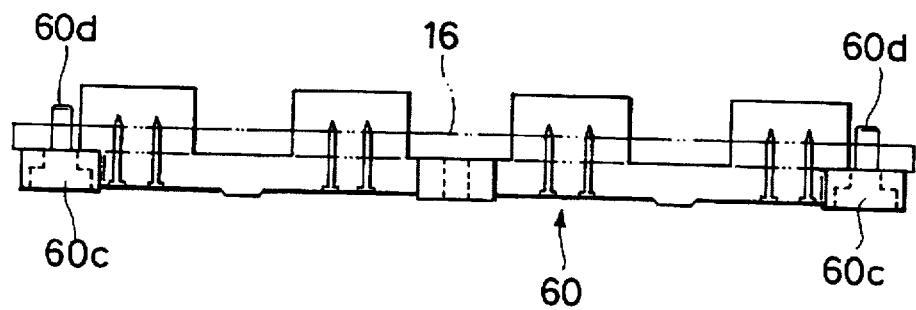
FIG. 39 is a view taken on line XXXIX—XXXIX in FIG. 38.

As shown in FIGS. 37 to 39, the male solenoid connector 60 is composed of a resin housing made of synthetic resin having flexibility. The male solenoid connector 60 is provided with an engaging recess 60a to be engaged with the solenoid connecting portion 59b of the female solenoid connector 59. Corresponding to each terminal insertion hole 59d of each solenoid connecting portion 59b, there is provided a male terminal 66 in the engaging recess 60a in such a manner that the male terminal 66 protrudes upward. The male terminal 66 is bent into a U-shape, and the other end portion of the male terminal 66 is connected to the circuit side of the printed mounting board 16 by means of soldering 66a.

As shown in FIGS. 37 and 38, when the solenoid connector 60 is engaged with the attaching hole 67 formed on the upper case 11, the engaging piece 60b is engaged in the attaching hole 67 in such a manner that the engaging piece 60b is locked by the action of elastic deformation of the solenoid connector 60. There are provided an appropriate number of engaging pieces 60b, the detail of which is described above, on one side of the male solenoid connector 60, that is, there is formed a lock mechanism for preventing the male solenoid connector 60 from being disconnected downward. In this case, as shown in FIG. 37, an extending piece portion 60c of the male solenoid connector 60 comes into contact with the upper case 11, 50 that the male solenoid connector 60 can be prevented from being disconnected upward when the female solenoid connector 59 is disconnected.

As shown in FIG. 37, there is provided a seal step portion 68 in the circumferential edge portion of the attaching hole 67 on the upper side of the upper case 11. Each male terminal 58 of the solenoid valve 4 is connected with each female connecting portion 61a of the female solenoid connector 59. Under the condition that the rubber ring 65 is attached to the outer circumferential edge of the flange base portion 59a, each solenoid connecting portion 59b is engaged with each engaging recess 60a of the male solenoid connector 60. Then each male terminal 66 is connected with each female connecting portion 61a on the other side via each terminal insertion hole 59d, and at the same time the flange base portion 59a and the rubber ring 65 are engaged with the seal step portion 68. Due to the integral connection of the electronic control unit 1 with the hydraulic unit 2, the rubber ring 65 is compressed between the hydraulic housing 3 and the seal step portion 68, so that the upper case 11 and the hydraulic housing 3 are sealed from each other.

In this embodiment, the electronic control unit 1 and the hydraulic unit 2 are integrally connected with each other by the aforementioned bolt 31 having a flange and a pair of bolts 70 screwed to the hydraulic housing 3 penetrating the upper case 11 as shown in FIG. 1.

Figure 40:
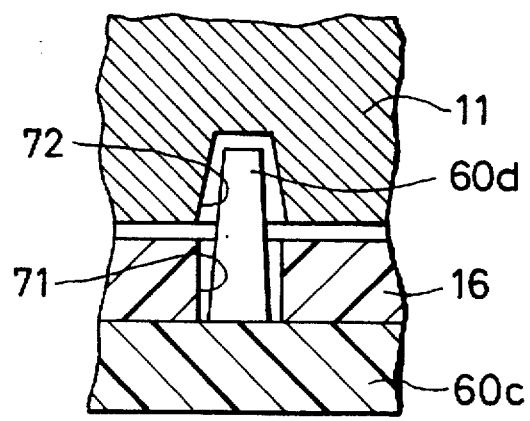
FIG. 40 is a cross-sectional view showing a primary portion of the positioning structure for positioning the upper case, the printed mounting board and the male solenoid connector.
Figure 41:
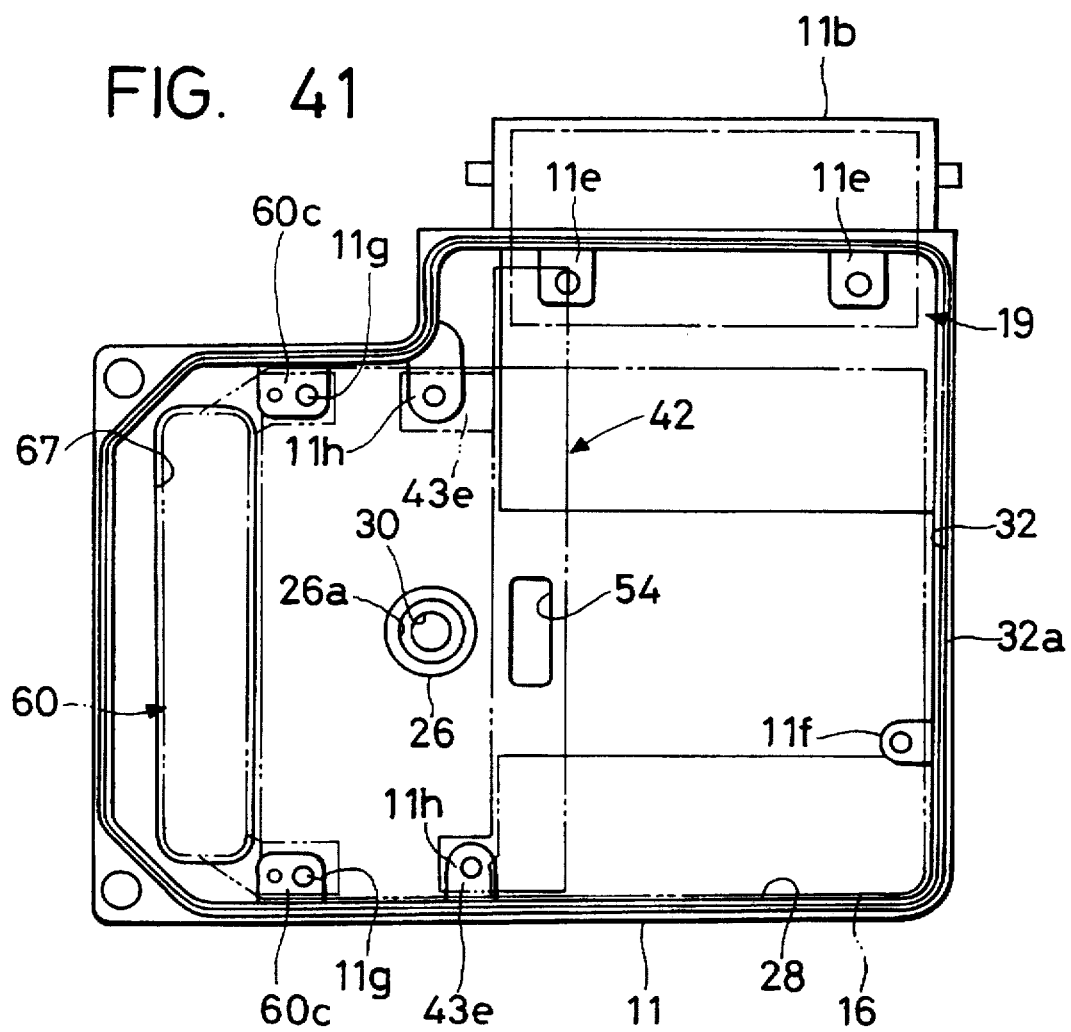
FIG. 41 is a bottom face view of the upper case.

As shown in FIG. 40, there is provided a positioning protrusion 60d which is attached to the extending piece 60c of the male solenoid connector 60. There are formed positioning holes 71, 72 on the printed mounting board 16 and the upper case 11 at positions corresponding to the positioning protrusion 60d. When the positioning protrusion 60d is inserted into the positioning holes 71, 72 in the process of assembling, each member can be positioned.

According to the connecting structure of the connector terminal unit with the printed mounting board which is applied to the electronic control unit integrated with a hydraulic unit in an anti-lock brake system of the present embodiment, since the connector terminal unit 19 is electrically connected with the printed mounting board 16 by FPC 88 having flexibility, it is possible for the connector terminal unit 19 to move in a range determined by the length of FPC 88 and further the posture of the connector terminal unit 19 can be freely changed. Accordingly, even when the position and posture of the connector housing 11b are changed, the connector terminal unit 19 can move in a wide range. For example, even when the design is changed in such a manner that the connector housing 11b is directed obliquely upward as shown by a two-dotted broken line in FIG. 7, it is not necessary to change the design of the connector terminal unit 19 and the printed mounting board 16. Even when there are provided a large number of connector terminals 75, they may be electrically connected with the auxiliary wiring board 86 at the same time, and the auxiliary wiring board 86 and the printed mounting board 16 may be electrically connected with each other by the FPC 88. In this way, the connector terminal unit 19 can be easily connected with the printed mounting board 16.

Since the connector terminal unit 19 is electrically connected with the printed mounting board 16 via FPC 88, they can be electrically connected with each other irrespective of errors caused in the process of manufacturing the printed mounting board 16 and errors caused in the process of assembling the printed mounting board 16 to the case 5.

When the auxiliary wiring board 86 is formed, it is formed integrally with the printed mounting board 16, and the auxiliary wiring board 86 and the printed mounting board 16 are electrically connected with each other by FPC 88 before the separation of them. Accordingly, the auxiliary wiring board 86 can be easily formed, and FPC 88 can be easily connected with the printed mounting boards 16, 86.

In this embodiment, the connecting structure for connecting a connector terminal unit with a printed mounting board of the present invention is explained with respect to a case of the electronic control unit integrated with a hydraulic unit in an anti-lock brake system. Of course, the present invention can be applied to other electronic units such as household electric appliances and office automation equipment.

Since there are provided a large number of connector terminals 75, the connector terminal unit 19 is connected with the auxiliary wiring board 86 via FPC 88 in this embodiment. However, as long as the electrical wires are flexible, other flat electrical wires or normal circular electrical wires may be used.

In this embodiment, the connector terminal 75 is connected with the auxiliary wiring board 86 in such a manner that the connector terminals 75 are inserted into and soldered to the through-holes 92 on the auxiliary wiring board 86. However, the connector terminals 75 may be directly soldered to the wiring pattern on the auxiliary wiring board 86, or alternatively terminals to be connected with may be provided on the auxiliary wiring board 86, and the terminal portion 75a of the connector terminal 75 may be inserted into these terminals to be connected with so that they can be electrically connected with each other.

Instead of using the straight connector terminals 75, approximately L-shaped connector terminals may be used in such manner that the terminals 75a of the approximately L-shaped connector terminals are protruded to the lower portion of the connector terminal unit 19 and connected with the auxiliary wiring board 86.

The connector terminal unit 19 is fixed to the connector connecting portion 11b of the upper case 11 by screws, and the male solenoid connector 60 is engaged with the attaching hole 67 of the upper case 11, so that the engaging piece 60b is engaged being locked. Under the above condition, the printed mounting board 16, on which the motor relay 17 and the fail-safe relay 18 are provided, is fixed to the upper case 11 by screws. Further, as shown in FIG. 37, the extending portion 60c of the male solenoid connector 60 is fixed to the printed mounting board 16 by the screw 75.

Then the electrical connection box 42 is attached to the upper case 11 while the connector side connecting portion 43a and the relay side connecting portion 43b of the electrical connection box 42 are respectively connected with the male terminal of the connector terminal unit 19 and the male terminal of the motor relay 17, and at the same time, the motor side connecting portion 43c is inserted into the insertion holes 53, 54. Then the lower case 12 is caulked to the lower side opening 28 of the upper case 11. In this way, the electronic control unit 1 is assembled.

The male terminal 58 of each solenoid valve 4 of the hydraulic unit 2 is previously connected with the solenoid connector 59. Under the condition that the rubber ring 65 is attached to the outer circumferential edge of the flange base 59a and that the rubber ring 52 is attached onto the annular wall 51, the hydraulic unit 2 is placed at a predetermined position on the electronic control unit 1, and each male terminal 45 of the motor 7 is connected with each relay terminal 46 of the motor side connecting portion 43c, and further each male terminal 66 of the solenoid connector connecting portion 60 is connected with each relay terminal 61 of the solenoid connector 59, and furthermore they are fastened by the bolt 31 having a flange and the bolt 70. In this way, the electronic control unit 1 and the hydraulic unit 2 are integrated with each other.

As described above, the connector connecting portion 11b on the electronic control unit 1 side with which the external connector 14 is connected is extended from a clearance formed between the upper face of the upper case 11 of the electronic control unit 1 and the motor 7 of the hydraulic unit 2, and the relatively large motor relay 17 and the fail-safe relay 18 are arranged at the position of the relay accommodating portion 11a provided in the clearance formed between the upper face of the upper case 11 and the motor 7 of the hydraulic unit 2. Accordingly, it is possible to effectively utilize a dead space formed between the upper face of the upper case 11 of the electronic control unit 1 and the motor 7, and also it is possible to form the upper case 11 to be flatter, so that the entire electronic control unit integrated with a hydraulic unit can be made compact.

On the wall 11c of the connector connecting portion 11b opposed to the hydraulic housing 3 of the hydraulic unit 2, there is provided a ventilation hole portion 21 having air-permeability and liquid-tightness. Due to the action of the above ventilation hole portion 21, it is possible to reduce a difference between the atmospheric pressure inside the case 5 of the electronic control unit 1 and the atmospheric pressure outside the case 5 when the pressure difference is made by a temperature change, and further it is possible to prevent water from entering the case 5. In this case, the ventilation hole portion 21 on the wall 11c is arranged being opposed to the hydraulic housing 3 leaving a small clearance between the ventilation hole portion 21 and the hydraulic housing 3. Therefore, water is not directly splashed on the ventilation hole portion 21, and further the ventilation hole portion 21 is not contacted with other members. Accordingly, damage of the ventilation hole portion 21 can be effectively prevented.

Further, the case 5 of the electronic control unit 1 is composed of the upper case 11 and the lower case 12, and the lower case 12 is caulked to the upper case 11 via the sealing agent 33 provided along the circumferential edge of the lower opening 28 of the upper case 11. Accordingly, the working property of assembling can be enhanced.

The upper case 11 is made of aluminum by means of die casting, and the lower case 12 is made of a metallic sheet by means of sheet metal forming. Accordingly, the cases 11, 12 can be easily manufactured, and the manufacturing cost can be reduced.

Further, when the hydraulic unit 2 is integrally connected with the electronic control unit 1, the male terminal 45 protruding downward at a position inside the annular wall portion 51 which protrudes in the lower portion of the motor 7, is connected with the relay terminal 46 on the electronic control unit 1 side, and further the rubber ring 52 attached to the annular wall portion 51 is compressed by the upper face of the upper case 11 of the electronic control unit 1. In this way, when the electronic control unit 1 is integrally connected with the hydraulic unit 2, the terminal 45 on the motor 7 side and the terminal 46 on the electronic control unit 1 side can be connected and the connecting portion can be easily sealed.

The chamber 35b, in which no brake fluid is stored, in the buffer chamber 35 provided in the hydraulic housing 3, is arranged facing the lower face of the hydraulic housing 3, and on the upper face of the upper case 11 of the electronic control unit 1, there is formed a communication groove 40 for communicating the chamber 35b, in which no brake fluid is stored, with the outside air. Accordingly, the chamber 35b, in which no brake fluid is stored, can be open to the atmosphere via the communicating groove 40, so that the piston 36 can be smoothly operated. Further, it is possible to let the brake fluid escape outside which has leaked from a clearance between the piston 36 and the inner circumferential wall face of the buffer chamber 35.

At the center of the upper case 11, there is provided a bolt insertion cylinder portion 26 which extends to the lower case 12. When the hydraulic unit 2 is integrated with the electronic control unit 1 by the bolt 31 having a flange, a clearance between the bolt insertion cylindrical portion 26 and the lower case 12 is sealed by the rubber ring 27. Accordingly, airtightness of the case 5 can be maintained by the rubber ring 27, and further the center of the lower case 12 can be supported by the bolt insertion cylindrical portion 26, and rigidity of the entire case 5 can be enhanced.

Heat generating members 55 such as a regulator are mounted on the conductive portion 56 provided on the printed mounting board 16 in such a manner that the heat generating members 55 come into contact with the conductive portion 56. Since the conductive portion 56 comes into contact with the upper case 11, heat generated by heat generating members 55 such as a regulator can be effectively dissipated outside the electronic control unit 1 via the conductive portion 56 and the upper case 11.

Figure 7:
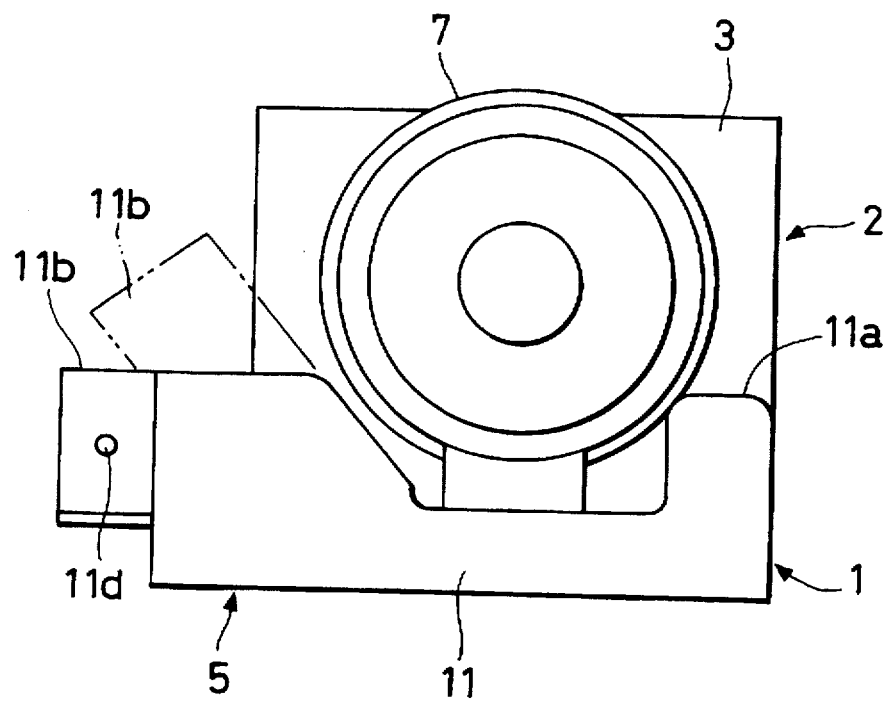
FIG. 7 is a right side view of FIG. 6.

In the above embodiment, the connector connecting portion 11b extends to the side with respect to the clearance between the upper face of the upper case 11 and the motor, however, as shown by an imaginary line in FIG. 7, the connector connecting portion 11b may be extended obliquely upward, and the extending direction may be appropriately determined by a positional relation between the connector connecting portion 11b and the external connector 14.

Further, the female solenoid connector 59 has a T-shaped female—female relay terminal 61, at both ends of which the female connecting portions 61a are provided. One of the female connecting portions 61a of the female—female relay terminal 61 is connected with the male terminal 58 protruding from the hydraulic housing 3. The other female connecting portion 61a of the female—female relay terminal 61 is connected with the male terminal 66 on the electronic control unit 1 side. When quality control and transportation of the hydraulic unit 2 is conducted under the condition that the male terminal 58 on the solenoid coil side protruding from the lower face of the hydraulic housing 3 of the hydraulic unit 2 is connected with one of the female connecting portions 61a of the female—female relay terminal 61 of the female solenoid connector 59, the male terminal 58 and female—female relay terminal 61 are not directly protruded and exposed outside. Therefore, the male terminal 58 and female—female relay terminal 61 can be protected by the resin housing of the female solenoid connector 59. Accordingly, it is possible to effectively prevent the male terminal 58 and female—female relay terminal 61 from being damaged when they come into contact or collide with other members. Therefore, quality control can be easily conducted.

When the U-shaped female—female relay terminal 61 is used, the following effects can be provided. In the connection of the male terminal 58 on the solenoid coil side in the hydraulic housing 3 with male terminal 66 on the electronic control unit 1 side, the positional allowance of the distance L (shown in FIG. 37) between both terminals can be absorbed, so that the degree of freedom can be increased when the electronic control unit 1 and the hydraulic unit; 2 are positioned.

Since the female—female relay terminal 61 is bent into a U-shape, the connecting structure can be made compact in the upward and downward direction.

In the U-shaped female—female relay terminal 61 of the female solenoid connector 59, the female connecting portion 61a with which the male terminal 58 on the movable solenoid coil side is connected is formed into a faston-shape and not fixed to the resin housing. The female connecting portion 61a with which the male terminal 66 on the electronic control unit 1 side is connected is formed into a tongue-shape and fixed to the resin housing. Accordingly, when the pressure of brake fluid is applied to the master cylinder, the male terminal 58 on the solenoid coil side is slightly moved in the upward and downward direction. However, since the male terminal 58 on the solenoid coil side is connected with the faston-shaped female connecting portion 61a of the female—female relay terminal 61, the contact pressure of which is high, and since this female connecting portion 61a is not fixed to the resin housing, the male terminal 58 and female connecting portion 61a are integrally moved in the upward and downward direction, so that the relative sliding motion can be prevented. Therefore, the occurrence of fretting corrosion can be effectively prevented.

Further, in the resin housing of the female solenoid connector 59, there is provided a positioning pin 63. In the hydraulic housing 3, at a position corresponding to the above positioning pin 63, there is provided a positioning hole 64. When the positioning pin 63 of the female solenoid connector 59 is press-fitted into the above positioning hole 64, the female solenoid connector 59 can be mechanically connected with the hydraulic housing 3. That is, positioning can be easily conducted and they can be easily connected with each other by means of press-fitting. Further, the connecting structure is simple, and the connecting structure, the dimensions of which are small, can be provided at low cost.

The male terminal 66 on the electronic control unit 1 side is formed into a U-shape, and the side of the male terminal with which the female solenoid connector 59 is not connected is soldered 66a to the printed mounting board 16. Therefore, when the female connecting portion 61a of the female—female relay terminal 61 is attached to the male terminal, or when the female—female relay terminal 61 is subjected to thermal expansion or shrinkage, stress caused in the soldered portion 66a, in which the male terminal 66 is soldered to the printed mounting board 16, can be reduced.

Further, the resin housing of the male solenoid connector 60 to fix the male terminal 66 onto the electronic control unit 1 side is locked by the upper case 11 made of aluminum, the engaging piece 60b and the extending piece 60c. Therefore, when the female solenoid connector 59 is inserted into or drawn out from the male solenoid connector 60, the resin housing of the male solenoid connector 60 can be effectively fixed to the upper case 11. Therefore, stress caused in the soldered portion 66a, in which the male terminal 66 is soldered to the printed mounting board 16, can be reduced.

Further, there are provided protrusions on the resin housing of the male solenoid connector, and there are formed holes corresponding to the above protrusions, on the printed mounting board and the electronic control unit case. When the protrusions are inserted into the holes in the process of assembling, the male solenoid connector can be positioned to the electronic control unit case. In this way, the male solenoid connector can be directly positioned to the electronic control unit case, and further the above positioning arrangement can be effectively utilized when the printed mounting board is temporarily fixed to the male solenoid connector.

Further, in the female solenoid connector 59, there is provided a flange base portion 59a for holding the rubber ring 65 on the lower face of the hydraulic housing 3. Therefore, when the electronic control unit 1 is integrated with the hydraulic unit 2, the seal step portion 68, in which the flange base portion 59a is engaged and the rubber ring 65 is closely contacted, can be formed at a corresponding position on the upper case 11. Accordingly, the rubber ring 65 can be easily positioned and attached, and the assembling workability can be enhanced.

The engaging piece 60b of the male solenoid connector 60 is engaged with the upper case 11 being locked, so that the male solenoid connector 60 is engaged with and held by the upper case 11 in the connecting structure of the embodiment. However, the same effect can be provided when the engaging piece to be engaged and locked with the printed mounting board 16 is provided in the male solenoid connector 60, and the male solenoid connector 60 is engaged with and held by the printed mounting board 16.

According to the electronic control unit integrated with a hydraulic unit in an anti-lock brake system arranged in the manner described above, the electrical circuit for supplying electrical power to the motor 7 is composed of a battery 108, a male terminal 80 for supplying electrical power source to the motor, bus bar 49, male terminal 130b for the motor relay, motor relay 17, male terminal 130a for the motor relay, bus bar 48, male terminal 45 for supplying electrical power source to the motor, motor 7, male terminal 45 for feeding electrical power to the motor, bus bar 47, and male terminal 80 for feeding electrical power to the motor. Accordingly, the electrical circuit has a sufficiently large electrical current capacity for driving the motor 7. Since this electrical circuit can be composed only when the male terminals 45, 80, 130a, 130b are respectively inserted into the relay terminals 46 of the electrical connection box 42, the assembling work is simple and the connecting structure is compact.

The male terminals 45, 80, 130a, 130b are respectively held by the relay terminals 46 in such a manner that the male terminals 45, 80, 130a, 130b can be freely slid in the arranging direction. Accordingly, even when the printed wiring board 16, bus bar holding case 43, bus bars 47, 48, 49 are displaced due to a difference of the thermal expansion coefficient, it is possible for the male terminals 45, 80, 130a, 130b to be electrically contacted with the relay terminals 46 and bus bars 47, 48, 49 in a good electrical contact condition. This is very effective when the electronic control unit integrated with a hydraulic unit is disposed at a position in the engine room of an automobile where the temperature is greatly changed.

There are formed guide faces 138b at the engaging protrusions 138a provided at the ends of the holding portion 138 for holding the bus bars 47, 48, 49, wherein the intervals of the guide faces 138b are reduced inward. On the other hand, since both sides on the upper faces of the bus bars 47, 48, 49 are chamfered, the holding portion 138 is uniformly extended to both sides when the bus bars 47, 48, 49 are inserted. Accordingly, it is possible to prevent the holding portion 38 from extending only onto one side, and damage of the holding portion 138 can be effectively prevented. Since the bus bars 47, 48, 49 can freely slide in the longitudinal direction being locked in such a manner that they can not be drawn out, there is no possibility that strain is caused between the bus bars due to a difference between the thermal expansion coefficients of the bus bars 47, 48, 49 and the thermal expansion coefficient of the holding case 43. Therefore, it is possible to positively fix and hold the bus bars. It is also possible to prevent the bus bars 47, 48, 49 from being disconnected from the electrical connection box 42 and coming into contact with the lower case 12.

The male terminals 130a, 130b for the motor relay are attached onto the printed wiring board 16 in such a manner that the intermediate portions of the male terminals are inserted into the holding holes 133 from the lower side and bent onto the upper face side of the printed wiring board 16. Therefore, in the assembling work in which the male terminals 130a, 130b for the motor relay are connected with the electrical connection box 42, it is possible to reduce an intensity of the external force applied to the soldered portion on the base side of the male terminals 130a, 130b for the motor relay.

Since the insulating spacer 135 is provided between the male terminals 130a, 130b for the motor relay and the relay accommodating portion 11a of the case 5, it is possible to prevent the circuit of the anti-lock brake system from being short-circuited because the insulating spacer 135 comes into contact with the upper case 11 made of aluminum.

In this embodiment, the male terminals 45, 80, 130a, 130b are aligned on the same straight line, however, they are not necessarily aligned on the same straight line. That is, when the bus bars 47, 48, 49 are appropriately provided in accordance with the positions of the male terminals 45, 80, 130a, 130b, it is possible to form a circuit capable of supplying a high intensity of electrical current to the motor. Further, each male terminal may be replaced with a female terminal.

In the above embodiment, the male terminals 130a, 130b for the motor relay are fixed onto the printed wiring board 16 by the holding portion 138. However, the following fixing means may be adopted. Protrusions may be formed on the printed wiring board 16 and inserted into intermediate portions of the male terminals 130a, 130b for the motor relay, and the end portions of the protrusions may be fused for fixing.

According to the electronic control unit in an anti-lock brake system arranged in the manner described above, the connector terminal unit 19 is engaged with the inside of the connector housing 11b from the lower side. Accordingly, it is not necessary to provide a large space at the rear of the connector housing 11b in the assembling work. Under the condition that the engaging protrusion 77 provided on the upper face of the connector terminal unit 19 is engaged with the engaging step portion 76 of the connector housing 11b in the inserting direction of the external connector 14, the bottom plate 19b is put on the lower side of the attaching pieces 82, 85, and the positioning protrusion 84 is inserted into the positioning hole of the attaching piece 85, and at the same time the screw 82a is set in the screw inserting hole 83 and screwed to the screw hole of the attaching piece 82. In this way, the connector terminal unit 19 is accommodated and disposed in the connector housing 11b. Therefore, only the lower side of the connector terminal unit 19 may be screwed. Accordingly, the attaching structure of the connector terminal unit 19 can be made compact. Further, the screw is attached only from the lower side on which the upper case 11 is open. Therefore, the attaching work is easy. In this connection, the engaging protrusion 77 of the connector terminal unit 19 is engaged with the engaging step portion 76 in the inserting direction of the external connector 14. Accordingly, the connector terminal unit can resist an insertion force applied when the external connector 14 is connected.

Since the connector housing 11b is formed integrally with the upper case 11 in the embodiment, it is not necessary to separately form the connector housing 11b, so that the formation of the connector housing is easy. Further the water proofing property of the connector housing 11b can be enhanced as compared with a case in which the connector housing 11b is separately formed.

Since the terminal portion 75a of the connector terminals 75 is soldered to the auxiliary wiring board 86 under the condition that the auxiliary wiring board 86 is held by the elastic hook 90 in the embodiment, soldering can be easily conducted, and after the completion of soldering, the external force is absorbed by the elastic hook 90, so that the intensity of the external force applied to the soldered portion can be reduced. Since the auxiliary wiring board 86 is held on the reverse side of the connector terminal unit 19 under the condition that the auxiliary wiring board 86 is locked, even when the connector terminal 75 is thermally expanded, the elastic hook 90 made of resin, the thermal expansion coefficient of which is higher than that of the terminal portion 75a made of metal, is elongated longer than the terminal portion 75a. Accordingly, there is formed a small clearance between the hook 90a and the reverse side of the connector terminal unit 19. Therefore, it is possible for the printed wiring board 16 to go back into the clearance. For this reason, a thermal expansion force is not applied to the soldered portion in which the connector terminal 75 is soldered to the auxiliary wiring board 86.

In this embodiment, the fixing portion of the above connector terminal unit 19 is formed into a box-shape when the bottom plate 19b is supported by the side wall 81a and the rear wall 81b. However, even when the main body 19a is directly screwed to the connector housing 11b, it is also possible to make the attaching structure of the connector terminal unit 19 compact.

In this embodiment, the fixing portion is fixed to the attaching portion by means of fastening screws, however, it is also possible to adopt the means of fastening bolts or fusing.

As described above, the connector terminal unit 19, the printed mounting board 16, the electrical connection box 42 and the solenoid connector connecting portion 60, which are accommodated in the case 5 of the electronic control unit 1, are directly fixed to the rigid upper case 11 made of aluminum by means of die casting. That is, this assembling system is based on the upper case 11. Therefore, it is sufficient to give consideration to the manufacturing errors caused between the members 16, 19, 42, 60 and the upper case 11. As compared with a system in which the members 16, 19, 42, 60 are fixed to the upper case 11 under the condition that they are previously assembled, the manufacturing errors of the members 16, 19, 42, 60 are not accumulated, so that the assembling allowance can be reduced. Therefore, the assembling accuracy of the electronic control unit 1 can be enhanced.

In the solenoid connector 59, there is provided a U-shaped relay terminal 61, both end portions of the linking portion 61b of which respectively have the female connecting portions 61a. One of the female connecting portions 61a of each relay terminal 61 in the solenoid connector 59 is respectively connected with each male terminal 58 protruding from the hydraulic housing 3, and the other female connecting portion 61a of each relay terminal 61 in the solenoid connector 59 is respectively connected with each male terminal on the electronic control unit 1 side. Under the condition that each male terminal 58 on each solenoid valve 4 side protruding from the lower face of the hydraulic housing 3 of the hydraulic unit 2 is inserted into and connected with one of the female connecting portions 61a of each relay terminal 61 in the solenoid connector 59, quality control or transportation of the hydraulic unit 2 is conducted, and the male terminals 58 and relay terminals 61 are not directly protruded outside. Therefore, they do not come into contact or collide with other members and the occurrence of damage can be effectively prevented and quality control can be easily carried out.

In this system, each male terminal 58 on each solenoid valve 4 side and each male terminal 66 on the electronic control unit 1 side are connected with each other by the substantially U-shaped relay terminal 61, both end portions of which respectively have the female connecting portions 61a. According to this connecting system, the degree of freedom can be increased by the linking portion 61b when the electronic control unit 1 and the hydraulic unit 2 are positioned to each other.

Since the relay terminal 61 is bent into a U-shape, as compared with a case in which the female connecting portions 61a are arranged on a straight line, the connecting structure can be made compact in the upward and downward direction when the electronic control unit and the hydraulic unit 2 are integrated with each other.

The relay terminal 61 is accommodated and held by the solenoid connector 59 under the condition that the displacement of the female connecting portion 61a is allowed. Under the condition that each male terminal 58 on each solenoid valve 4 side is respectively connected with each female connecting portion 61a, the female connecting portion 61a is also moved in the upward and downward direction in accordance with the upward and downward motion of each male terminal 58 caused by the solenoid valve 4. Due to the foregoing, the upward and downward motion of each male terminal 58 can be effectively absorbed, and the occurrence of fretting corrosion caused between the male terminal 58 and the female connecting portion 61a can be effectively prevented.

In the case 5, there is provided a solenoid connector connecting portion 60 having an engaging recess 60a with which the solenoid connecting portion 59b of the solenoid connector 59 is engaged. In the solenoid connector connecting portion 60, there is provided an engaging piece 60b which is engaged with and held by the case 5, and into the engaging recess 60a, there is protruded a male terminal 66 on the electronic control unit 1 side. In the connection of the male terminal 66 on the electronic control unit 1 side with the male terminal 58 on the solenoid valve 4 side conducted via the relay terminal 61, in the case where each engaging recess 60a of the solenoid connector connecting portion 60 is engaged with each solenoid connecting portion 59b, a load imposed on the connecting structure in the process of engagement is mainly received by the engaging piece 60b. Accordingly, the load is not given to the soldered portion of the male terminal 66 on the printed mounting board 16 side. Therefore, damage of the soldered connecting portion can be effectively prevented.

On the lower face of the hydraulic housing 3 in the solenoid connector 59, there is provided a flange base portion 59a for holding the rubber ring 65. At a corresponding position of the upper case 11, there is provided a seal step portion 68 with which the above flange base portion 59a is engaged and the rubber ring 65 closely comes into contact when the electronic control unit 1 is integrated with the hydraulic unit 2. Due to the above arrangement, it is easy to position and attach the rubber ring 65 to the hydraulic housing 3. Therefore, the assembling work property can be enhanced.

In the above embodiment, the connector connecting portion 11b extends to the side with respect to the clearance between the upper face of the upper case 11 and the motor, however, as shown by an imaginary line in FIG. 7, the connector connecting portion 11b may be extended obliquely upward, and the extending direction may be appropriately determined by a positional relation between the connector connecting portion 11b and the external connector 14.

The lower case 12 is made of a metal sheet by means of sheet metal forming, however, it may be made of aluminum.

As described above, according to the connecting structure of the connector terminal unit with the wiring board of the present invention, the posture and position of the connector terminal unit can be freely adjusted within the length of the flexible wire. Accordingly, it is possible to accommodate the connector terminal in the connector housing in accordance with the position of the connector housing which changes in a wide range. Therefore, for example, even when it is necessary to change the position of the connector housing in order to change the design, it is unnecessary to change the connecting structure of the connector terminal unit and the wiring board. Further, since the wiring board is electrically connected with the connector terminal unit via the flexible wire, relative positions of the wiring board and the connector terminal can be arbitrarily determined. Consequently, it is possible to electrically connect the wiring board with the connector terminal unit irrespective of the errors caused in the process of manufacturing the wiring board and also irrespective of the errors caused in the process of assembling the wiring board to the case, and further the allowance can be extended with respect to the errors.

When the flexible wire is composed of a flat cable as shown in the embodiment, it is easy to electrically connect a large number of connector terminals with the wiring board. Therefore, the assembling efficiency can be enhanced.

According to the assembling method for assembling the connector terminal unit to the wiring board of the present invention, the wiring board and the auxiliary wiring board are integrally formed in such a manner that they can be arbitrarily detached from each other. Therefore, the wiring board and the auxiliary wiring board can be easily formed. Further, before they are separated from each other, each wiring board is connected with a flexible wire. Therefore, the flexible wire can be easily connected to the wiring board, and the efficiency of assembling work can be enhanced.

As described above, in the electronic control unit integrated with a hydraulic unit in an anti-lock brake system of the present invention, a connecting portion of the connector on the electronic control unit side to which an external connector for supplying electrical power is connected is arranged being extended in a clearance formed between an upper face of the case of the electronic control unit and the motor. Accordingly, a dead space formed between the upper face of the case of the electronic control unit and the motor can be effectively utilized and the overall electronic control unit integrated with a hydraulic unit can be made compact.

On the wall of the case of the electronic control unit, which is not horizontal, opposed to the hydraulic housing of the hydraulic unit, there is provided a ventilation hole portion having air-permeability and liquid-tightness. Due to the action of the above ventilation hole portion, it is possible to reduce a difference between the atmospheric pressure inside the case of the electronic control unit and the atmospheric pressure outside the case when the pressure difference is caused by a temperature change, and further it is possible to prevent water from entering the case. In this case, the ventilation hole portion on the case wall is arranged being opposed to the hydraulic unit. Therefore, water is not directly splashed on the ventilation hole portion, and further the ventilation hole portion is not contacted with other members. Accordingly, damage of the ventilation hole portion can be effectively prevented.

Further, the case of the electronic control unit is composed of the upper case and the plate-shaped lower case which closes an opening on the lower side of the upper case, and the lower case is caulked to the upper case via the sealing agent provided along the circumferential edge of the lower opening of the upper case. Accordingly, the working property of assembling can be enhanced.

The upper case is made of aluminum by means of die casting, and the lower case is made of a metallic sheet by means of sheet metal forming. Accordingly, the cases can be easily manufactured, and the manufacturing cost can be reduced.

Further, when the hydraulic unit is integrally connected with the electronic control unit, the terminal protruding downward at a position inside the annular wall portion which protrudes in the lower portion of the motor, is connected with the relay terminal on the electronic control unit side, and further the rubber ring attached to the annular wall portion is compressed by the upper face of the upper case of the electronic control unit. In this way, when the electronic control unit is integrally connected with the hydraulic unit, the terminal on the motor side and the terminal on the electronic control unit side can be connected and the connecting portion can be easily sealed.

There is provided a buffer chamber in the hydraulic housing for temporarily storing the brake fluid when the anti-lock brake is operated. Facing the lower side of the hydraulic housing, there is provided a chamber in which no brake fluid is stored being partitioned by a piston in the buffer chamber. On the upper case of the electronic control unit, there is provided a communicating groove for communicating the chamber in which no brake fluid is stored with the outside air. According to the above structure, the chamber in which no brake fluid is stored can be open to the atmospheric air through the communicating groove, so that the piston can be moved smoothly, and further the brake fluid which has leaked out from a clearance between the piston and the inner circumferential face of the buffer chamber can be allowed to escape outside.

Further, at the center of the upper case, there is provided a bolt inserting cylindrical portion which is arranged from the center of the upper case to the lower case. In order to integrally connect the hydraulic unit with the electronic control unit, bolts are inserted into from the lower case to the upper case through the bolt inserting cylindrical portion, and the hydraulic unit is fastened by these bolts, and a clearance between the bolt inserting cylindrical portion and the lower case is sealed by the rubber ring. Due to the above structure, the case can be hermetically sealed by the rubber ring, and further the center of the lower case is supported by the bolt inserting cylindrical portion so that the rigidity of the entire case can be enhanced.

The electronic control unit has a printed mounting board, and heat generating members such as a regulator are mounted on the conductive portion provided on the printed mounting board in such a manner that the heat generating members come into contact with the conductive portion, and further the conductive portion comes into contact with the upper case. Due to the above arrangement, heat generated by the heat generating members such as a regulator can be effectively dissipated outside via the upper case.

The electronic control unit integrated with a hydraulic unit in an anti-lock brake system of the present invention comprises a solenoid female connector composed of a U-shaped female—female relay terminal and a resin housing. In this case, the U-shaped female—female relay terminal has female connecting portions at both ends with which male terminals on the solenoid coil side and male terminals connected with the print mounting board on the electronic control unit side are connected. Therefore, the hydraulic unit and the electronic control unit are mechanically connected with each other via the solenoid female connector, and at the same time the male terminals on the solenoid coil side and the electronic control unit are electrically connected. When quality control and transportation of the hydraulic unit is conducted under the condition that the male terminals on the solenoid coil side protruding from the lower face of the hydraulic housing of the hydraulic unit are connected with one of the female connecting portions of the female—female relay terminal of the solenoid female connector, male terminals do not protrude outside directly, but they can be protected by the resin housing. Accordingly, it is possible to prevent the male terminals from contacting or colliding with other parts, so that the male terminals can be prevented from being damaged. As a result, quality control can be easily carried out. When the U-shaped female—female relay terminals are used, in the connection of the male terminals on the solenoid coil side in the hydraulic housing with the male terminals on the electronic control unit side, it is possible to absorb a positional error which is in a range of allowance. Accordingly, the degree of freedom can be enhanced in the process of positioning the electronic control unit and the hydraulic unit. Since the female—female relay terminal is bent into a U-shape, it is possible to reduce the height of the connecting structure, so that the overall structure can be made compact.

In the U-shaped female—female relay terminal of the female solenoid connector, the female connecting portion with which the male terminal on the movable solenoid coil side is connected is formed into a faston-shape and not fixed to the resin housing. The female connecting portion with which the male terminal on the electronic control unit side is connected is formed into a tongue-shape and fixed to the resin housing. According to the above structure, when the pressure of brake fluid is applied to the master cylinder, the male terminal on the solenoid coil side is slightly moved in the upward and downward direction. However, since the male terminal on the solenoid coil side is connected with the faston-shaped female connecting portion of the female—female relay terminal, the contact pressure of which is high, and since this female connecting portion is not fixed to the resin housing, the male terminal and female connecting portion are integrally moved in the upward and downward direction, so that the relative sliding motion can be prevented. Therefore, the occurrence of fretting corrosion can be effectively prevented.

Further, in the resin housing of the female solenoid connector, there is provided a protrusion. In the hydraulic housing, at a position corresponding to the above protrusion, there is provided a positioning hole. When the protrusion of the female solenoid connector is press-fitted into the above positioning hole, the female solenoid connector can be mechanically connected with the hydraulic housing. Due to the above structure, positioning can be easily conducted and they can be easily connected with each other by means of press-fitting. Further, the connecting structure is simple, and the connecting structure, the dimensions of which are small, can be provided at low cost.

The male terminal on the electronic control unit side is formed into a U-shape, and the side of the male terminal with which the female solenoid connector is not connected is soldered to the printed mounting board 16. Therefore, when the female connecting portion of the female—female relay terminal is attached to the male terminal, or when the female—female relay terminal is subjected to thermal expansion or shrinkage, stress caused in the soldered portion, in which the male terminal is soldered to the printed mounting board, can be reduced.

Further, the resin housing of the male solenoid connector to fix the male terminal on the electronic control unit side is locked by the upper case made of metal. Therefore, when the female solenoid connector is inserted into or drawn out from the male solenoid connector, the resin housing can be effectively fixed to the case of the electronic control unit. Therefore, stress caused in the connecting portion, in which the male terminal is connected to the printed mounting board, can be reduced.

Further, there are provided protrusions on the resin housing of the male solenoid connector, and there are formed holes corresponding to the above protrusions, on the printed mounting board and the electronic control unit case. When the protrusions are inserted into the holes in the process of assembling, the male solenoid connector can be positioned to the electronic control unit case. In this way, the male solenoid connector can be directly positioned to the electronic control unit case, and further the above positioning arrangement can be effectively utilized when the printed mounting board is temporarily fixed to the male solenoid connector.

Further, in the female solenoid connector, there is provided a flange base portion for holding the rubber ring on the lower face of the hydraulic housing. Therefore, when the electronic control unit is integrated with the hydraulic unit, the seal step portion, in which the flange base portion is engaged and the rubber ring is closely contacted, can be formed at a corresponding position on the upper case of the electronic control unit. Accordingly, the rubber ring can be easily positioned and attached, and the assembling workability can be enhanced.

As described above, according to the electronic control unit integrated with a hydraulic unit in an anti-lock brake system of the present invention, the motor power source supplying terminal, the motor relay terminal and the motor power feeding terminal are electrically connected with each other via the bus bar. Therefore, it is possible to form a circuit, the electrical current capacity of which is high, and a high intensity of electrical current can be made to flow in the circuit.

Even when the bus bar expands and contracts due to a change in the temperature caused in the bus bar, the bus bar can be electrically connected with each terminal via the relay terminal in a good electrical condition. This is very effective when the electronic control unit integrated with a hydraulic unit is disposed at a position in the engine room of an automobile where the temperature is greatly changed.

Since the terminal for the motor relay is directly fixed onto the printed wiring board, a load imposed on the soldered portion can be reduced. Therefore, it is possible to prevent the motor relay from being disconnected from the motor relay connecting terminal in the process of assembling.

Further, even if the case is made of metal, it is possible to prevent a short-circuit between the case and the motor relay terminal.

As described above, according to the electronic control unit integrated with a hydraulic unit in an anti-lock brake system of the present invention, only when the other side of the main body of the connector terminal unit is adhered, it is possible to fix the connector terminal unit to the connector housing. Accordingly, the attaching structure of the connector terminal unit can be made compact. Therefore, the entire electronic control unit integrated with a hydraulic unit can be made compact.

When the connector housing is integrated with the case, the number of parts is reduced, so that the connector can be easily formed.

When the auxiliary board is held by the elastic hook in such a manner that the auxiliary board can be locked, an intensity of the external force applied to the connector that has been soldered to the auxiliary wiring board can be reduced by the action of the elastic hook. Therefore, the soldered portion is not disconnected from the auxiliary wiring board, and a good electrical contact condition can be always provided.

According to the electronic control unit integrated with a hydraulic unit in an anti-lock brake system of the present invention, the electronic control section includes a printed mounting board. The case of the electronic control unit is composed of an upper case made of aluminum by means of die casting and a plate-shaped lower case which closes an opening portion on the lower side of the upper case. In the upper case, there is provided a connector connecting portion with which the external connector for supplying electrical power is connected. The external connector is electrically connected with the connector connecting portion of the upper case, and the connector terminal unit is fixed, and the printed mounting board is fixed to the upper case. Further, an electrical connection box is fixed to the upper case, wherein the electrical connection box composes a motor drive circuit when the connecting terminals on the connector terminal unit side, the motor relay side on the printed mounting board and the motor side are connected with each other. In the solenoid connector connecting portion provided with the connecting terminal on the electronic unit side with which the connecting terminal on the solenoid valve side is connected, there is provided an engaging portion engaged with and held by the upper case. According to the present invention, the connector terminal unit, the printed mounting board, the electrical connection box and the solenoid connector connecting portion are directly fixed to the upper case made of aluminum by means of die casting. Due to the above assembling system, it is sufficient to give consideration to the manufacturing error caused between each member and the upper case. Accordingly, as compared with an assembling system in which the members are fixed to the upper case under the condition that they have already been assembled, the manufacturing errors of the members are not accumulated, and the assembly allowance can be reduced.

Therefore, the assembling accuracy of the electronic control unit can be enhanced.

When the lower case is caulked to the upper case through a sealing agent provided at the circumferential edge of the lower opening of the upper case, the assembling work property can be enhanced.

When the lower case is made of a metallic sheet by means of sheet metal forming, it is easy to manufacture the lower case, so that the manufacturing cost can be reduced.

Further, a connecting portion of the connector on the electronic control unit side to which an external connector is connected is arranged being extended in a clearance formed between the upper face of the case of the electronic control unit and the motor. Accordingly, a dead space formed between the upper face of the case of the electronic control unit and the motor can be effectively utilized and the overall electronic control unit integrated with a hydraulic unit can be made compact.

What is claimed is:

1. An electronic control unit integrated with a hydraulic unit in an anti-lock brake system comprising:

an electronic control unit having a case, a connector housing and an electronic control section for controlling brake fluid pressure so that each of a plurality of wheels is not locked;

a connector terminal unit located in the connector housing of the case of the electronic control unit; and a hydraulic unit for opening and closing a solenoid valve provided in a hydraulic housing in accordance with a control signal sent from the electronic control section so as to control the brake fluid pressure of each wheel, the hydraulic unit having a motor for driving a pump to return the brake fluid, wherein the connector terminal unit has a main body provided with a plurality of connector terminals, an engaging protrusion is formed on one side of an outer circumferential side face of the main body, a fixing portion is formed on the other side face, an engaging step portion capable of engaging with the engaging protrusion in the direction of insertion of an external connector is provided on an inner circumferential face of the connector housing, an attaching portion capable of being attached to the fixing portion is provided on the connector housing, and the connector terminal unit is accommodated in the connector housing when the fixing portion is put on and fixed to the attaching portion under the condition that the engaging protrusion of the main body is engaged with the engaging step portion.

2. The electronic control unit integrated with a hydraulic unit in an anti-lock brake system according to claim 1, wherein the connector housing is formed integrally with the case.

3. The electronic control unit integrated with a hydraulic unit in an anti-lock brake system according to claim 1, further comprising an auxiliary wiring board, wherein a plurality of elastic hooks are integrally provided on a reverse side of the main body, the auxiliary wiring board is held on, and locked to, the reverse side of the main body, and the connector terminal protruding from the reverse side of the main body penetrates the auxiliary wiring board and is soldered onto it.

4. An electronic control unit integrated with a hydraulic unit in an anti-lock brake system comprising:

a rotation detecting device for detecting a rotating condition of each wheel of an automobile;

a hydraulic unit for controlling the brake fluid pressure in a wheel cylinder of each wheel by opening and closing a solenoid valve through a solenoid coil in a hydraulic housing in accordance with an electronic control signal, the hydraulic unit having a motor to drive a pump for returning the brake fluid to a master cylinder;

an electronic control unit for forming the control signal to control the brake fluid pressure in accordance with the detection conducted by the rotation detecting device, the electronic control unit having a connector for connecting to an external connector;

a motor relay for supplying and stopping an electrical power supply to the motor, the motor relay being provided in the electronic control unit; and a fail-safe relay for supplying and stopping an electrical power supply to a solenoid and the motor relay provided in the electronic control unit, wherein male terminals protruding downward from a lower face of the hydraulic housing are connected with connecting terminals on the electronic control unit when the hydraulic unit is mechanically connected with the electronic control unit, and a connecting portion of the connector on the electronic control unit to which the external connector for supplying electrical power is connected is arranged being extended into a clearance formed between an upper face of the case of the electronic control unit and the motor.

5. The electronic control unit integrate with a hydraulic unit in an anti-lock brake system according to claim 4, further comprising a ventilating hole portion having air-permeability and liquid-tightness, the ventilating hole portion being opposed to the hydraulic unit and provided on a case wall of the electronic control unit which is not horizontal.

6. The electronic control unit integrated with a hydraulic unit in an anti-lock brake system according to claim 4, wherein the electronic control unit case includes an upper case and a plate-shaped lower case closing a lower opening portion of the upper case, and the lower case is caulked to the upper case through a sealing agent provided along a circumferential edge of the lower opening of the upper case.

7. The electronic control unit integrated with a hydraulic unit in an anti-lock brake system according to claim 6, wherein the upper case is made of aluminum by means of die casting, and the lower case is made of a metallic sheet by means of sheet metal forming.

8. The electronic control unit integrated with a hydraulic unit in an anti-lock brake system according to claim 4, wherein a connecting terminal protruding downward located in an annular wall portion which protrudes to the lower portion of the motor is connected with a connecting terminal on the electronic control unit side when the hydraulic unit is integrally connected with the electronic control unit, and a rubber ring arranged along the annular wall portion is compressed by an upper face of the case of the electronic control unit.

9. The electronic control unit integrated with a hydraulic unit in an anti-lock brake system according to claim 4, wherein the hydraulic housing includes a buffer chamber for temporarily storing the brake fluid in the anti-lock braking operation, and a chamber, in which no brake fluid is stored, partitioned from the buffer chamber by a piston, faces a lower face of the hydraulic housing, and a communicating groove for communicating the chamber, in which no brake fluid is stored, with the outside air is formed on an upper face of the case of the electronic control unit.

10. The electronic control unit integrated with a hydraulic unit in an anti-lock brake system according to claim 7, wherein a bolt inserting cylindrical portion extending to the lower case is provided at a center of the upper case, and the hydraulic unit is fastened by a through-bolt which penetrates from the lower case to the upper case via the bolt inserting cylindrical portion so that the hydraulic unit can be integrated with the electronic control unit, and a clearance between the bolt inserting cylindrical portion and the lower case is sealed up with a rubber ring.

11. The electronic control unit integrated with a hydraulic unit in an anti-lock brake system according to claim 7, wherein the electronic control unit includes a printed mounting board, and heat generating members such as a regulator are mounted on a conductive portion provided on the printed mounting board, and the conductive portion comes into contact with the upper case.

12. An electronic control unit integrated with a hydraulic unit in an anti-lock brake system comprising:

- a rotation detecting device for detecting a rotating condition of each wheel of an automobile;
- a hydraulic unit for controlling the brake fluid pressure in a wheel cylinder of each wheel by opening and closing a solenoid valve through a solenoid coil in a hydraulic housing in accordance with an electronic control signal, the hydraulic unit having a motor to drive a pump for returning the brake fluid to a master cylinder;
- an electronic control unit for forming the control signal to control the brake fluid pressure in accordance with the detection conducted by the rotation detecting device;
- a motor relay for supplying and stopping an electrical power supply to the motor, the motor relay being provided in the electronic control unit;
- a fail-safe relay for supplying and stopping an electrical power supply to a solenoid and the motor relay provided in the electronic control unit; and
- a solenoid female connector comprised of a U-shaped female—female relay terminal and a resin housing, the U-shaped female—female relay terminal having female connecting portions at both ends with which male terminals on a solenoid coil side and male terminals connected with a printed mounting board on an electronic control unit side are connected;

wherein male terminals on the solenoid coil side protruding downward from a lower face of the hydraulic housing are connected with connecting terminals on the electronic control unit side when the hydraulic unit is mechanically connected with the electronic control unit, and wherein the hydraulic unit and the electronic control unit are mechanically connected with each other by the solenoid female connector, and at the same time the male terminals on the solenoid coil side and the male terminals on the electronic control unit are electrically connected.

13. The electronic control unit integrated with a hydraulic unit in an anti-lock brake system according to claim 12, wherein a female connecting portion of the U-shaped female—female relay terminal of the female solenoid connector to be connected with a male terminal on the solenoid coil side which is a movable portion, is formed into a faston-shape and not fixed to the resin housing, and a female connecting portion connected with a male terminal on the electronic control unit side is formed into a tongue-shape and fixed to the resin housing.

14. The electronic control unit integrated with a hydraulic unit in an anti-lock brake system according to claim 12, wherein a protrusion is formed on the resin housing of the female solenoid connector, a hole is formed at a position in the hydraulic housing corresponding to the protrusion, and the protrusion of the female solenoid connector is press-fitted into the hole so as to mechanically connect the female solenoid connector with the hydraulic housing.

15. The electronic control unit integrated with a hydraulic unit in an anti-lock brake system according to claim 12, wherein the male terminal on the electronic control unit side is formed into a U-shape, and the male terminal with which the female solenoid connector is not connected is soldered to the printed mounting board.

16. The electronic control unit integrated with a hydraulic unit in an anti-lock brake system according to claim 12, wherein the resin housing of the male solenoid connector to fix the male terminal onto the electronic control unit side is locked to the electronic control unit case made of metal so that the resin housing can not be drawn out.

17. The electronic control unit integrated with a hydraulic unit in an anti-lock brake system according to claim 12, wherein a protrusion is formed in the resin housing of the male solenoid connector, holes are formed at positions on the printed mounting board and the electronic control unit case corresponding to the protrusion, and members can be positioned to each other when the protrusion is inserted into each hole in the process of assembling.

18. The electronic control unit integrated with a hydraulic unit in an anti-lock brake system according to claim 12, wherein a flange holding portion for holding a rubber ring along a lower face of the hydraulic housing is provided in the resin housing of the female solenoid connector, and a seal step portion with which the flange holding portion is engaged and the rubber ring is closely contacted when the electronic control unit is integrated with the hydraulic unit, is formed at a corresponding position on the electronic control unit case.

19. An electronic control unit integrated with a hydraulic unit in an anti-lock brake system comprising:

- an electronic control unit having a case and an electronic control section for controlling the brake fluid pressure so that each wheel is not locked;
- a hydraulic unit for opening and closing a solenoid valve provided in a hydraulic housing in accordance with a control signal sent from the electronic control section so as to control the brake fluid pressure of each wheel, the hydraulic unit having a motor for returning the brake fluid, wherein a connector portion for supplying electrical power to the motor is provided in the case, a motor relay is provided for controlling the feeding of electrical power from the connector portion to the motor when a contact point is turned on and off in accordance with a control signal sent from the electronic control section, a motor power source supply terminal of the connector portion and a motor relay terminal for electrically connecting with the contact point of the motor relay are provided in the case, the motor power source supply terminal penetrates the case and extends into the case, and an electrical power supply path for supplying electrical power to the motor is formed when the motor power source supply terminal and the motor relay terminal are electrically connected with each other by a bus bar in the case, and the motor power source supply terminal, the motor relay terminal and a motor power feeding terminal are arranged on the same plane in the same direction, the bus bar is formed into a long-plate-shape in the direction of arrangement of each terminal, each terminal is electrically connected with the bus bar via the relay terminal, and the relay terminal is connected with the motor power source supply terminal, the motor power feeding terminal and the bus bar under the condition that the relay terminal is capable of freely sliding along the direction of arrangement of the terminals.

20. The electronic control unit integrate with a hydraulic unit in an anti-lock brake system according to claim 19, wherein the electronic control unit includes a printed wiring board accommodated in the case, a base end of the motor relay terminal is arranged on a reverse side of the printed wiring board, the motor relay is arranged on a front face of the printed wiring board, the motor relay is electrically connected with the base end of the motor relay terminal penetrating the printed wiring board, and an intermediate portion between the base end of the motor relay terminal and a fore end of the motor relay terminal connected with the bus bar is fixed onto the printed wiring board.

21. The electronic control unit integrated with a hydraulic unit in an anti-lock brake system according to claim 19, wherein the case of the electronic control unit is made of metal, and an insulating spacer is interposed between the motor relay terminal and the case.

22. An electronic control unit integrated with a hydraulic unit in an anti-lock brake system comprising:
- a rotation detecting device for detecting a rotating condition of each wheel of an automobile;
- a hydraulic unit for controlling brake fluid pressure in a wheel cylinder of each wheel by opening and closing a solenoid valve through a solenoid coil in a hydraulic housing in accordance with an electronic control signal, the hydraulic unit having a motor to drive a pump for returning the brake fluid to a master cylinder;
- an electronic control unit, having a case, for forming the control signal to control the brake fluid pressure in accordance with the detection conducted by the rotation detecting device;
- a motor relay for supplying and stopping an electrical power supply to the motor; and
- a fail-safe relay for supplying and stopping an electrical power supply to a solenoid provided in the electronic control unit and also an electrical power supply to the motor relay, wherein male terminals on a solenoid coil side protruding downward from a lower face of the hydraulic housing are connected with connecting terminals on an electronic control unit side when the hydraulic unit is mechanically connected with the electronic control unit, and wherein the electronic control unit includes a printed mounting board with a solenoid connector connecting portion, the case of the electronic control unit is comprised of an upper case made of aluminum by means of die casting and a plate-shaped lower case which closes an opening portion on the lower side of the upper case, in the upper case there is provided a connector connecting portion with which an external connector for supplying electrical power is connected, a connector terminal unit with which the external connector is electrically connected is fixed to the connector connecting portion of the upper case, the printed mounting board is fixed to the upper case, an electrical connection box is fixed to the upper case wherein the electrical connection box composes a motor drive circuit by connecting connecting terminals of the connector terminal unit, the motor relay on the printed mounting board and the motor with each other, and an engaging portion engaged with and held by the upper case is provided in the solenoid connector connecting portion, the connecting terminal on the electronic control unit side with which the connecting terminal on the solenoid coil side is connected being provided in the solenoid connector connecting portion.

23. The electronic control unit integrated with a hydraulic unit in an anti-lock brake system according to claim 22, wherein the lower case is caulked to the upper case via a sealing agent provided along a circumferential edge of the opening on the lower side of the upper case.

24. The electronic control unit integrated with a hydraulic unit in an anti-lock brake system according to claim 22, wherein the lower case is made of a metallic sheet by means of sheet metal forming.

25. The electronic control unit integrated with a hydraulic unit in an anti-lock brake system according to claim 22, wherein the connector connecting portion extends from a clearance formed between an upper face of the case of the electronic control unit and the motor.

* * * * *